(12) United States Patent
Yoshida et al.

(10) Patent No.: US 10,620,730 B2
(45) Date of Patent: Apr. 14, 2020

(54) DISPLAY DEVICE

(71) Applicant: SHARP KABUSHIKI KAISHA, Sakai, Osaka (JP)

(72) Inventors: Masahiro Yoshida, Sakai (JP); Isao Ogasawara, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 107 days.

(21) Appl. No.: 15/753,769

(22) PCT Filed: Aug. 12, 2016

(86) PCT No.: PCT/JP2016/073699
§ 371 (c)(1),
(2) Date: Feb. 20, 2018

(87) PCT Pub. No.: WO2017/033759
PCT Pub. Date: Mar. 2, 2017

(65) Prior Publication Data
US 2018/0239476 A1 Aug. 23, 2018

(30) Foreign Application Priority Data

Aug. 21, 2015 (JP) ................................. 2015-163656

(51) Int. Cl.
*G06F 3/041* (2006.01)
*G02F 1/1345* (2006.01)
(Continued)

(52) U.S. Cl.
CPC .......... *G06F 3/0412* (2013.01); *G02F 1/1339* (2013.01); *G02F 1/1345* (2013.01);
(Continued)

(58) Field of Classification Search
CPC combination set(s) only.
See application file for complete search history.

(56) References Cited

U.S. PATENT DOCUMENTS

| 2005/0180083 A1* | 8/2005 | Takahara | ............... G09G 3/006 |
|---|---|---|---|
| | | | 361/152 |
| 2006/0098521 A1* | 5/2006 | Shimoda | ............... H01L 27/124 |
| | | | 365/230.06 |

(Continued)

FOREIGN PATENT DOCUMENTS

| JP | 2014-164752 A | 9/2014 |
|---|---|---|
| JP | 2015-064854 A | 4/2015 |

(Continued)

*Primary Examiner* — Kwin Xie
(74) *Attorney, Agent, or Firm* — ScienBiziP, P.C.

(57) ABSTRACT

An active matrix substrate includes: first to third lines in first to third line layers, respectively, a signal that is different from a signal supplied to the first lines and the second lines being supplied to the third lines; first connection lines that connect the first lines or the second lines with first terminals; second connection lines that connect the third lines with second terminals; inspection TFTs 61 connected with the second connection lines; and common lines 63, 64. Each of the second connection lines 24c is connected to any one of the common lines through the inspection TFT 61. A space between the adjacent two second connection lines 24c connected to the same common line through the second connection line switching elements is wider than a space between the second connection lines 24c connected to different ones of the common lines, respectively, through the second connection line switching elements.

15 Claims, 22 Drawing Sheets

(51) Int. Cl.
    *G02F 1/1368*     (2006.01)
    *G02F 1/1335*     (2006.01)
    *G02F 1/1339*     (2006.01)
    *G02F 1/1362*     (2006.01)
    *G06F 3/044*     (2006.01)
    *H01L 27/12*     (2006.01)
    *G02F 1/1333*     (2006.01)

(52) U.S. Cl.
    CPC ...... *G02F 1/1368* (2013.01); *G02F 1/133512* (2013.01); *G02F 1/136286* (2013.01); *G06F 3/044* (2013.01); *G06F 3/0416* (2013.01); *H01L 27/124* (2013.01); *G02F 1/13338* (2013.01); *G02F 2201/123* (2013.01)

(56) References Cited

U.S. PATENT DOCUMENTS

| | | | |
|---|---|---|---|
| 2014/0240279 A1 | 8/2014 | Hwang et al. | |
| 2015/0070616 A1* | 3/2015 | Ogasawara | G02F 1/1339 349/43 |
| 2015/0084912 A1* | 3/2015 | Seo | G06F 3/0412 345/174 |
| 2015/0097810 A1 | 4/2015 | Aoki et al. | |
| 2015/0185927 A1* | 7/2015 | Inoue | G06F 3/044 345/174 |

FOREIGN PATENT DOCUMENTS

| | | |
|---|---|---|
| JP | 2015-072662 A | 4/2015 |
| JP | 2015-072663 A | 4/2015 |

\* cited by examiner

DISPLAY DEVICE

TECHNICAL FIELD

The present invention relates to a display device.

BACKGROUND ART

Patent Document 1 discloses a display device having a touch detection function in which a common electrode is divided into a plurality of pieces, and the plurality of the common electrode pieces are used as touch electrodes. In the display device having a touch detection function disclosed in Patent Document 1, a plurality of common electrode pieces obtained by dividing the common electrode and the controller are connected with each other by a plurality of signal lines, so that the controller detects a touch position.

PRIOR ART DOCUMENT

Patent Document

Patent Document 1: JP-A-2015-64854

SUMMARY OF THE INVENTION

Problem to be Solved by the Invention

Here, as a method for detecting a short circuit of a plurality of signal lines that connect the common electrode pieces and the controller, a method of causing a specific pattern to be displayed by supplying a predetermined signal via the plurality of signal lines to the plurality of common electrode pieces is considered. Different signals are supplied to adjacent ones of a plurality of signal lines, and when the adjacent ones of the signal lines are short-circuited, one and the same signal is supplied from the adjacent signal lines, which allows the short circuit to be detected. On the other hand, in a case where the same signal is supplied to adjacent ones of the signal lines in a certain part, even if a short circuit occurs to the adjacent signal lines, the same signal is supplied therefrom, which is the state before the short circuit, and this does not allow the short circuit to be detected.

It is an object of the present invention to provide a display device in which the occurrence of a short circuit to two lines to which the same signal is input, among adjacent lines and connection lines connected to the foregoing adjacent lines, can be suppressed.

Means to Solve the Problem

A display device according to one embodiment of the present invention includes an active matrix substrate; a counter substrate opposed to the active matrix substrate; a display function layer arranged between the active matrix substrate and the counter substrate; and a sealing member that seals the display function layer between the active matrix substrate and the counter substrate. The active matrix substrate includes: first lines formed in a first line layer; second lines formed in a second line layer that is different from the first line layer; third lines formed in a third line layer that is different from the first line layer and the second line layer, a signal that is different from a signal supplied to the first lines and the second lines being supplied to the third lines; first terminals electrically connected to the first lines or the second lines; second terminals electrically connected with the third lines; first connection lines that connect the first lines or the second lines with the first terminals; second connection lines that connect the third lines with the second terminals; second connection line switching elements that are connected with the second connection lines; and two or more common lines each of which is connected with any one of a plurality of the second connection line switching elements. Each of the second connection lines is connected with any one of the two or more common lines through the second connection line switching element; and among spaces each of which is between adjacent two of the second connection lines, a space between the second connection lines connected to the same one of the common lines through the second connection line switching elements is wider than a space between the second connection lines that are connected to different ones of the common lines, respectively, through the second connection line switching elements.

Effect of the Invention

According to the disclosure of the present embodiment, a display device in which the occurrence of a short circuit to two second connection lines to which the same signal is input can be suppressed.

MODE FOR CARRYING OUT THE INVENTION

Figure 1:
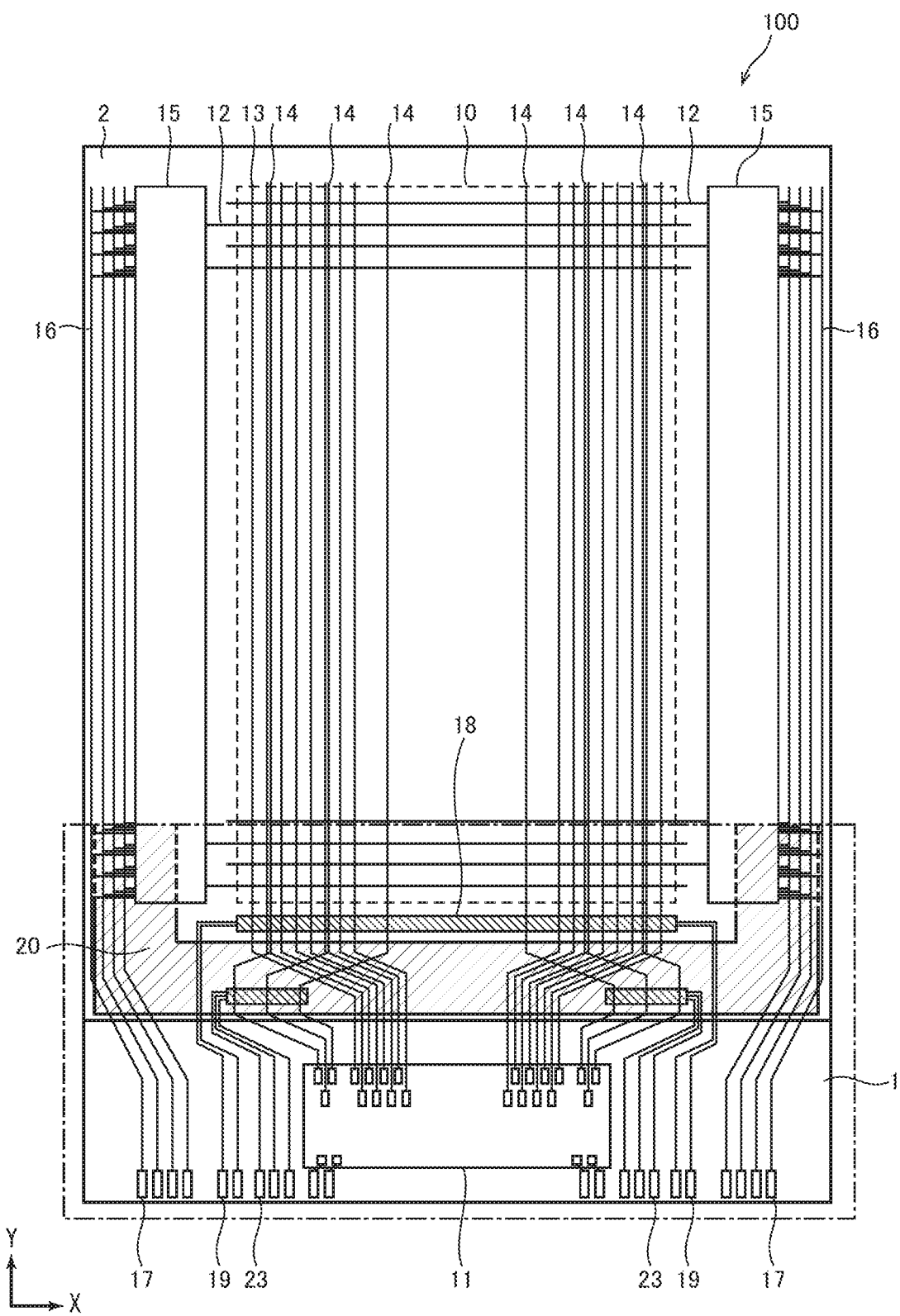
FIG. 1 is a plan view illustrating an exemplary schematic configuration of a display device in Embodiment 1.

A display device according to one embodiment of the present invention includes an active matrix substrate; a counter substrate opposed to the active matrix substrate; a display function layer arranged between the active matrix substrate and the counter substrate; and a sealing member that seals the display function layer between the active matrix substrate and the counter substrate. The active matrix substrate includes: first lines formed in a first line layer; second lines formed in a second line layer that is different from the first line layer; third lines formed in a third line layer that is different from the first line layer and the second line layer, a signal that is different from a signal supplied to the first lines and the second lines being supplied to the third lines; first terminals electrically connected to the first lines or the second lines; second terminals electrically connected with the third lines; first connection lines that connect the first lines or the second lines with the first terminals; second connection lines that connect the third lines with the second terminals; second connection line switching elements that are connected with the second connection lines; and two or more common lines each of which is connected with any one of a plurality of the second connection line switching elements. Each of the second connection lines is connected with any one of the two or more common lines through the second connection line switching element; and among spaces each of which is between adjacent two of the second connection lines, a space between the second connection lines connected to the same one of the common lines through the second connection line switching elements is wider than a space between the second connection lines that are connected to different ones of the common lines, respectively, through the second connection line switching elements (the first configuration).

According to the first configuration, a space between the second connection lines connected to the same one of the common lines is wider than a space between the second connection lines that are connected to different ones of the common lines, respectively. This makes it possible to suppress the occurrence of a short circuit between two of the second connection lines to which the same signal is input.

A display device according to one embodiment of the present invention includes: an active matrix substrate; a counter substrate opposed to the active matrix substrate; a display function layer arranged between the active matrix substrate and the counter substrate; and a sealing member that seals the display function layer between the active matrix substrate and the counter substrate. The active matrix substrate includes: first lines formed in a first line layer; second lines formed in a second line layer that is different from the first line layer; third lines formed in a third line layer that is different from the first line layer and the second line layer, the third lines being lines different from the first lines and the second lines; first terminals electrically connected to the first lines or the second lines; second terminals electrically connected with the third lines; first connection lines that connect the first lines or the second lines with the first terminals; second connection lines that connect the third lines with the second terminals; second connection line switching elements that are connected with the second connection lines; two or more common lines each of which is connected with any one of a plurality of the second connection line switching elements; and a dummy line arranged between two adjacent ones of the second connection lines. Each of the second connection lines is connected with any one of the two or more common lines through the second connection line switching element, and the dummy line is arranged between two adjacent ones of the second connection lines, the two adjacent ones being connected to the same one of the two or more common lines through the second connection line switching elements (the second configuration).

According to the second configuration, a dummy line is arranged between two of the second connection lines connected to the same common line. This makes it possible to suppress the occurrence of a short circuit between two of the second connection lines to which the same signal is input.

The first or second configuration may be further characterized in that each of the second connection lines has a part formed in the third line layer and a part formed in the first line layer or the second line layer, and a boundary between the part formed in the third line layer, and the part formed in the first line layer or the second line layer, is present in a sealing area where the sealing member is arranged, or in an area between the sealing area and a display area (the third configuration).

According to the third configuration, a part of the second connection line formed in the third line layer is present in an area where the counter substrate is present on an opposite surface side. The possibility of occurrence of corrosion of lines, therefore, decreases even in a case where the third line layer is present in an upper layer with respect to the first line layer or the second line layer, which means there are fewer protection layers.

The third configuration may be further characterized in that at least parts of two adjacent ones of the second connection lines are formed alternately in the first line layer and the second line layer, in a region between the sealing area and the second terminals (the fourth configuration).

According to the fourth configuration, at least parts of the adjacent two of the second connection lines are formed in different line layers alternately. This makes it possible to suppress the occurrence of a short circuit between the second connection lines, as compared with a configuration in which the second connection lines are formed in the same line layer.

The fourth configuration may be further characterized in that at least the parts of two adjacent ones of the second connection lines, which are formed alternately in the first line layer and the second line layer, are superposed on each other when viewed in a plan view (the fifth configuration).

With the fifth configuration, the light-transmitting areas can be widened.

Any one of the first to fifth configurations may be further characterized in that the second connection line switching elements are arranged in the sealing area where the sealing member is arranged, or in the area between the sealing area and the display area (the sixth configuration).

According to the sixth configuration, the second connection line switching elements are provided in the area where the counter substrate is present, whereby the second connection line switching elements can be protected.

Any one of the first to sixth configuration may be further characterized in that the active matrix substrate further includes electrodes each of which is connected with any one of the two or more common lines, through the second connection lines, the two or more common lines include a first common line and a second common line, and the electrodes connected with the first common line through the second connection lines, and the electrodes connected with the second common line through the second connection lines, are arranged in a stripe form (the seventh configuration).

With the seventh configuration, a stripe pattern is displayed by supplying different signals to the electrodes connected to the first common line and the electrodes connected to the second common line, whereby a short circuit or a disconnection in the second connection lines can be easily detected. Further, in such a configuration, the occurrence of a short circuit to two of the second connection lines to which the same signal is input can be suppressed.

Any one of the first to sixth configurations can be characterized in that the active matrix substrate further includes electrodes each of which is connected with any one of the two or more common lines, through the second connection lines, the two or more common lines include a first common line and a second common line, and the electrodes connected with the first common line through the second connection lines, and the electrodes connected with the second common lines through the second connection lines, are arranged in a checkered pattern form (the eighth configuration).

With the eighth configuration, a checkered pattern is displayed by supplying different signals to the electrodes connected to the first common line and the electrodes connected to the second common line, whereby a short circuit or a disconnection in the second connection lines can be easily detected. Further, in such a configuration, the occurrence of a short circuit to two of the second connection lines to which the same signal is input can be suppressed.

Any one of the first to eighth configurations may be further characterized in that the active matrix substrate further includes first connection line switching elements electrically connected with the first terminals, and the first connection line switching elements are arranged on a side opposite to the first connection lines with respect to the first terminals, so that the first terminals are interposed therebetween (the ninth configuration).

In the case of the ninth configuration, it is not necessary to arrange the first connection line switching elements in an area near the display area. This makes it possible to reduce the frame area, as compared with a configuration in which the first connection line switching elements are arranged in the sealing area or on an inner side with respect to the sealing area (on the display area side).

The ninth configuration may be further characterized in that the first connection line switching elements are arranged on a side opposite to the first connection lines and the second connection lines with respect to the first terminals and the second terminals, so that the first terminals and the second terminals are interposed therebetween (the tenth configuration).

With the tenth configuration, the first connection line switching elements can be arranged in a wider area, which makes it possible to suppress the occurrence of a short circuit to the lines connected to the first connection line switching elements.

Any one of the first to tenth configurations may be further characterized in that the sealing member is made of a material that is cured when being irradiated with light; either of two of the first connection lines that are respectively connected to two adjacent ones of the first lines or to two adjacent ones of the second lines is at least partially formed in one of the first line layer and the second line layer, and the other one of the two of the first connection lines is at least partially formed in the other one of the first line layer and the second line layer; and the first connection lines and the second connection lines are partially superposed when viewed in a plan view, in the sealing area where the sealing member is arranged, and in areas that are in the sealing area and where the first connection lines and the second connection lines are superposed, the two of the first connection lines are at least partially superposed when viewed in a plan view (the eleventh configuration).

With the eleventh configuration, larger light-transmitting areas where neither the first connection lines nor the second connection lines are arranged can be ensured. This makes it possible to prevent the sealing member from becoming undercured.

The eleventh configuration may be further characterized in that, in areas that are in the sealing area and where the first connection lines and the second connection lines are superposed, the two of the first connection lines are superposed over the full width thereof when viewed in a plan view (the twelfth configuration).

With the twelfth configuration, further larger light-transmitting areas can be ensured, whereby it is possible to more effectively prevent the sealing member from becoming undercured.

Any one of the first to twelfth configuration can be further characterized in that the second connection line switching elements are arranged on a side opposite to the second connection lines with respect to the second terminals, so that the second terminals are interposed therebetween (the thirteenth configuration).

With the thirteenth configuration, the light-transmitting areas can be made larger, as compared with the configuration in which the second connection line switching elements are formed in the sealing area.

The second configuration may be further characterized in that the dummy line is connected, through the second connection line switching element, to the common line that is different from the common line to which two of the second connection lines arranged on both sides of the dummy line are connected through the second connection line switching elements (the fourteenth configuration).

With the fourteenth configuration, in a case where two adjacent ones of the second connection lines are short-circuited via the dummy line, the short circuit of the two adjacent ones of the second connection lines can be detected, since different signals are supplied to the second connection lines, as compared with the state before the short circuit.

Any one of the first to fourteenth configurations may be further characterized in that the active matrix substrate further includes a plurality of touch position detection electrodes, and the third lines are connected with the touch position detection electrodes (the fifteenth configuration).

With the fifteenth configuration, a short circuit can be prevented from occurring to two second connection lines to which the same signal is input, in a display device that includes touch sensor electrodes.

Embodiment

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, the dimension ratios of the constituent members illustrated in the drawings do not necessarily indicate the real dimension ratios.

Embodiment 1

FIG. 1 is a plan view illustrating an exemplary schematic configuration of a display device 100 in Embodiment 1. This display device 100 is a display that has a function of detecting a touch position, which is a display used in, for example, a mobile phone, a portable information terminal, a game machine, a digital camera, a printer, an automotive navigation system, information appliance, or the like.

Figure 4:
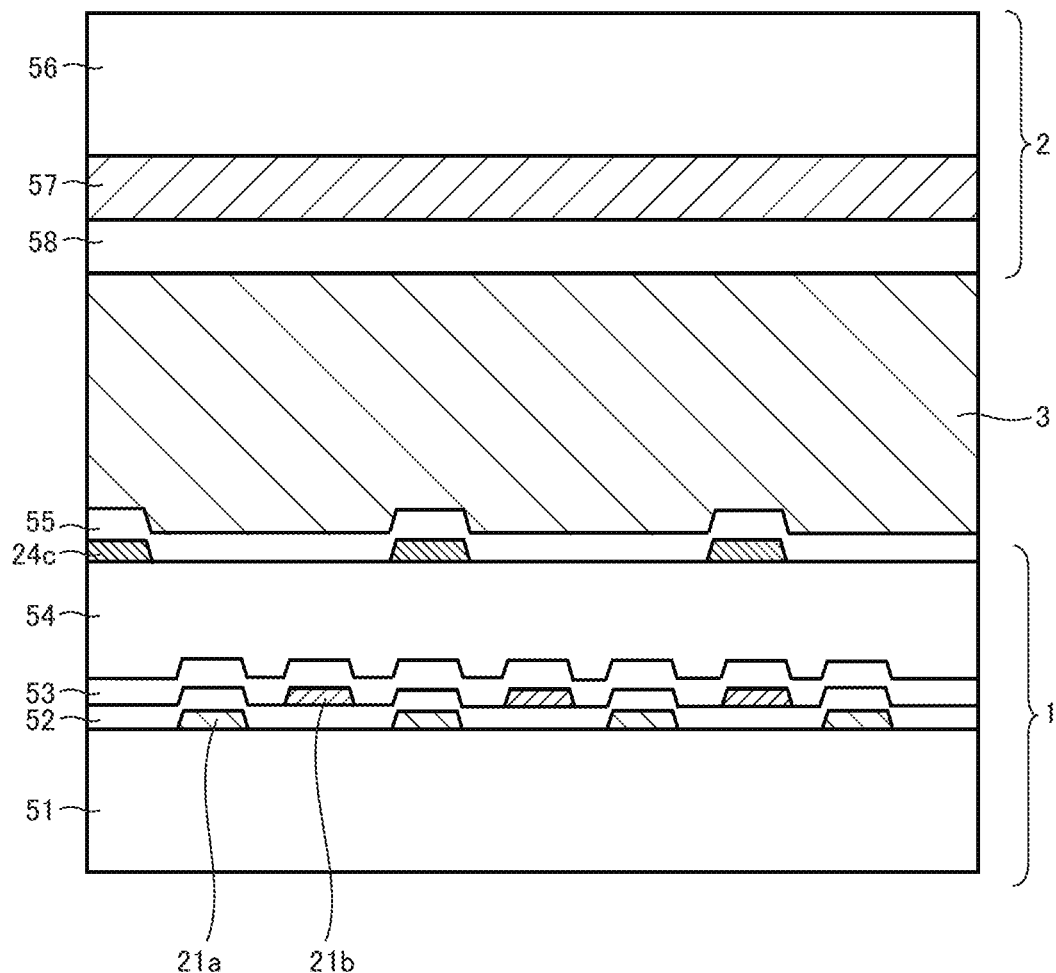
FIG. 4 is a cross-sectional view illustrating a sealing area in an area where first connection lines and second connection lines are arranged.

This display device 100 is a liquid crystal display that includes an active matrix substrate 1, a counter substrate 2, a liquid crystal layer (not shown) that is a display function layer interposed between the active matrix substrate 1 and the counter substrate 2, a sealing member 3 that seals the liquid crystal layer between the active matrix substrate 1 and the counter substrate 2 (see FIG. 4). As illustrated in FIG. 1, the display device 100 is in a portrait-oriented rectangular shape as a whole. The long side direction of the display device 100 coincides with the Y axis direction, and the short side direction thereof coincides with the X axis direction.

In FIG. 1, the area surrounded by a dotted line is a display area 10 in which an image can be displayed. The area outside the display area 10 is a non-display area in which an image cannot be displayed.

Each of the active matrix substrate 1 and the counter substrate 2 includes a substantially transparent glass substrate. As illustrated in FIG. 1, the dimension of the long side of the counter substrate 2 is shorter than the dimension of the long side of the active matrix substrate 1. An area on which the counter substrate 2 does not overlap, therefore, exists over a predetermined range in an end part of the active matrix substrate 1, at an end on one side in the long side direction (the end part on the lower side in FIG. 2). In this area, a driving circuit 11 is arranged. The driving circuit 11 is connected to an external control circuit via flexible printed circuits (FPC) that are not illustrated.

On the active matrix substrate 1, a plurality of gate lines (first lines) 12 and a plurality of source lines (second lines) 13 are arranged. Each gate line 12 extends in the X axis direction, and a plurality of the same are arrayed in the Y axis direction. Each source line 13 extends in the Y axis direction, and a plurality of the same are arrayed in the X axis direction. The gate lines 12 are formed in a first line layer, and the source lines 13 are formed in a second line layer that is a layer different from the first line layer. Each of the gate lines 12 and the source lines 13 are formed with, for example, a metal film made of aluminum, copper, titanium, molybdenum, chromium, or the like, or an alloy of any of these, or alternatively a laminate film made of any of these.

As illustrated in FIG. 1, the gate lines 12 and the source lines 13 intersect with each other. In the vicinities of positions at which the gate lines 12 and the source lines 13 intersect, thin film transistors (not shown) as switching elements are arranged. Each gate electrode of the thin film transistor is connected to the gate line 12, and each source electrode thereof is connected to the source line 13. Further, the drain electrode of the thin film transistor is connected to a pixel electrode (not shown).

The display device 100 in the present embodiment is characterized in that the method for driving liquid crystal molecules included in a liquid crystal layer is of a horizontal electric field driving mode, such as the in-plane switching (IPS) mode, or the fringe-field switching (FFS) mode. To realize the method of the horizontal electric field driving mode, pixel electrodes and counter electrodes (also referred to as common electrodes in some cases) for forming electric fields are formed on the active matrix substrate 1.

Figure 2:
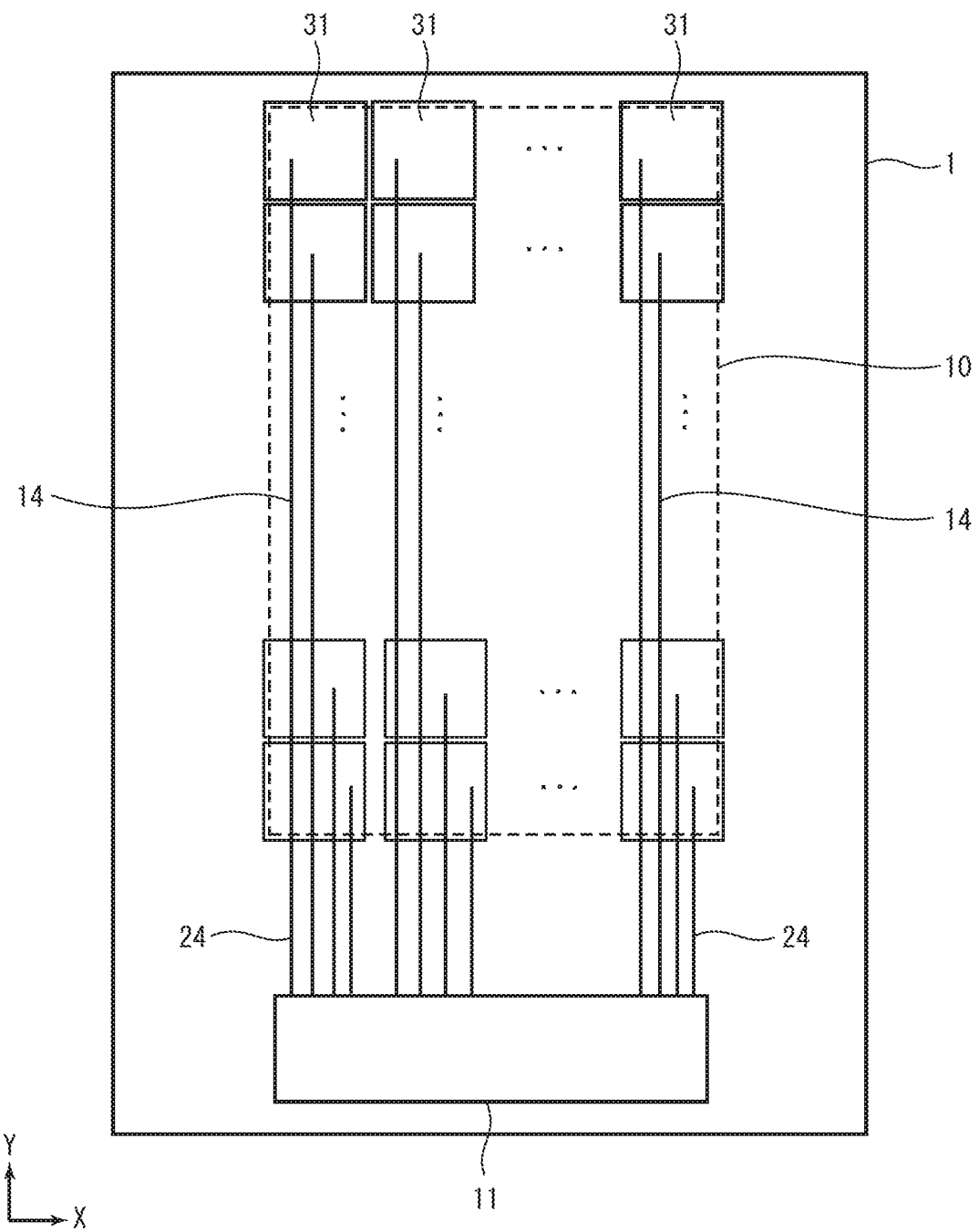
FIG. 2 illustrates an exemplary arrangement of counter electrodes.

FIG. 2 illustrates an exemplary arrangement of counter electrodes 31. Each counter electrode 31 is in a rectangular shape, and a plurality of the same are arrayed in matrix in the display area 10. These counter electrodes 31 also function as touch sensor electrodes for detecting a touch position. Though the illustration is omitted, a plurality of slits for generating a horizontal electric field are provided in the counter electrode 31.

Each counter electrode 31 is connected with the driving circuit 11, through a touch sensor line (third line) 14 and a second connection line 24 extending in the Y axis direction. The touch sensor lines 14 are formed in a third line layer, which is a layer different from the first line layer and the second line layer, and a signal different from those supplied to the gate lines 12 and the source lines 13 is supplied to the touch sensor lines 14. Each of the touch sensor lines 14 and the second connection line 24 are formed with, for example, a metal film made of copper, titanium, molybdenum, aluminum, chromium, or the like, or an alloy of any of these, or alternatively a laminate film made of any of these. In FIG. 2, the second connection line 24 is illustrated as being in a straight-line shape, but actually, as illustrated in FIG. 1, it is not in a straight-line shape.

The following description briefly describes a method for detecting a touch position. A parasitic capacitor is formed between a certain one of the counter electrodes 31 and an adjacent one counter electrode or the like, and when a human finger or the like is brought into contact with a display screen of the display device 100, a capacitor is formed between the human finger or the like and the counter electrode. This causes an electrostatic capacitance to increase. In controlling the touch position detection, the driving circuit 11 supplies a touch driving signal to the counter electrodes 31 through the touch sensor lines 14, and receives the touch detection signal through the touch sensor lines 14. By doing so, the driving circuit 11 detects changes in the electrostatic capacitances, and detects a touch position. This touch position detection method is of a so-called self-capacitance type.

On the active matrix substrate 1, a pair of gate drivers 15 are arranged on both outer sides in the short side direction of the display area 10. Each gate line 12 is connected with either one of the gate drivers 15. The gate drivers 15 are connected with signal electrodes 17 for the driving of the gate drivers (hereinafter referred to as "gate driver driving signal electrodes 17") through gate driver driving lines 16. The gate drivers 15 include scanning circuits that supply a scanning signal input from an external control circuit through the gate driver driving lines 16, to each gate line 12 at predetermined timings, thereby sequentially scanning the gate lines 12.

As described above, the sealing member 3 is provided so as to seal the liquid crystal layer between the active matrix substrate 1 and the counter substrate 2. In the sealing member 3, a photocurable resin that is cured when being irradiated with light is used. The photocurable resin may be a resin that is cured when being irradiated with ultraviolet light, or may be a resin that is cured when being irradiated with visible light. Further alternatively, the resin may be a resin that is cured when being irradiated with light other than ultraviolet light or visible light. The material for the sealing member, however, is not limited to a photocurable resin, but may be, for example, a resin of a thermosetting type. Further alternatively, the sealing member may have both of photocurable properties and thermosetting properties.

Here, an area where the sealing member 3 is arranged is called a "sealing area 20". Though being illustrated only partially in FIG. 1, the sealing area 20 is formed outside the display area 10, enclosing the display area 10.

Figure 3:
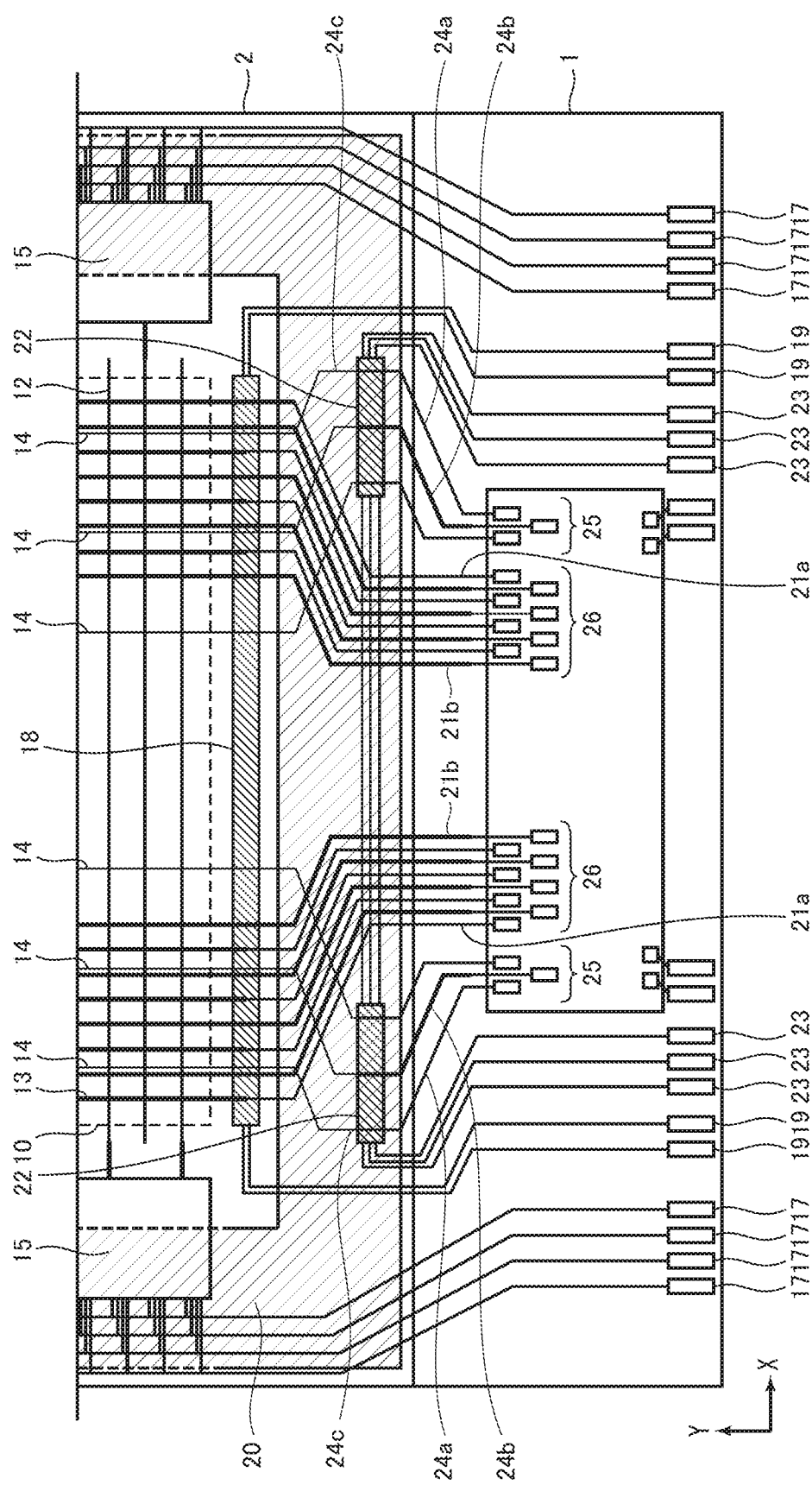
FIG. 3 is an enlarged view illustrating an area surrounded by a dashed dotted line in FIG. 1.

FIG. 3 is an enlarged view illustrating an area surrounded by a dashed dotted line in FIG. 1. On the active matrix substrate 1, a source line inspection pattern 18 is provided. The source line inspection pattern 18 is provided with a plurality of switching elements (inspection TFTs) for controlling the supply of signals to the source lines 13 so as to detect a short circuit or a disconnection of the source lines 13. The source line inspection pattern 18 is connected to terminals 19 to which source line inspection signals are input (hereinafter referred to as "source line inspection signal input terminals 19"). To the source line inspection signal input terminals 19, source line inspection signals are input from an external control circuit.

The source lines 13 are provided inside the display area 10. In the non-display area outside the display area 10, first connection lines 21 are provided. The first connection lines 21 are lines for connecting the source lines 13 and signal output terminals 26 for the source lines (hereinafter referred to as "source line signal output terminals") (first terminals) in the non-display area. In other words, the source lines 13 are electrically connected with the source line signal output terminals 26 through the first connection lines 21. The first connection lines 21 are formed with, for example, a metal film made of aluminum, copper, titanium, molybdenum, chromium, or the like, or an alloy of any of these, or alternatively a laminate film made of any of these.

Parts of the first connection lines 21 between the source lines 13 and the source line inspection pattern 18 are formed in the same layer as that of the source lines 13, i.e., the second line layer. On the other hand, among parts of the first connection lines 21 between the source line inspection pattern 18 and the source line signal output terminals 26, the parts of some of the lines are formed in the same layer as that of the source line 13, i.e., the second line layer, and the parts of the other lines are formed in the same layer as that of the gate lines 12, i.e., the first line layer. Here, among the parts of the first connection lines 21 between the source line inspection pattern 18 and the source line signal output terminals 26, the parts of the first connection lines 21 formed in the first line layer are referred to as "first connection lines 21a", and the parts of the first connection lines 21 formed in the second line layer are referred to as "first connection lines 21b". In a case where there is no need to distinguish the first connection lines 21a and the first connection lines 21b, they are referred to generally as the "first connection lines 21".

The first connection lines 21a and the first connection lines 21b are arranged alternately. In other words, one of two adjacent source lines 13 is connected with the first connection line 21a, and the other of the two is connected with the first connection line 21b.

On the active matrix substrate 1, touch sensor inspection patterns 22 are provided. In the present embodiment, the touch sensor inspection patterns 22 are arranged at two positions, but the positions are not limited to two positions. Each touch sensor inspection pattern 22 is provided with a plurality of switching elements (inspection TFTs) for controlling the signal supply to the touch sensor lines 14 so as to detect a short circuit or a disconnection of the touch sensor lines 14. The touch sensor inspection patterns 22 are connected with terminals 23 to which touch sensor inspection signals are input (hereinafter referred to as "touch sensor inspection signal input terminals 23"). To the touch sensor inspection signal input terminals 23, touch sensor inspection signals are input from an external control circuit. It should be noted that, in each of the touch sensor inspection patterns 22 at the two positions, lines for inputting the same touch sensor inspection signal may be connected with one another. Such a configuration allows a difference between the transmission properties of the touch sensor inspection signals to be suppressed at the touch sensor inspection patterns 22 at two positions, thereby reducing display irregularities during inspection. Further, this achieves an effect of causing charges to be easily dispersed so that specific portions of the touch sensor inspection patterns 22 and the counter electrodes 31 should not be charged. Here, these connection lines are formed using a third line layer, whereby these lines can be formed without any additional step in the manufacture process.

The touch sensor lines 14 are provided in the display area 10. In the non-display area, which is outside the display area 10, the second connection lines 24 are provided. The second connection lines 24 are lines for connecting the touch sensor lines 14 and signal output terminals 25 for touch sensor (hereinafter referred to as "touch sensor signal output terminals 25") (second terminals) in the non-display area. In other words, the touch sensor lines 14 are electrically connected with the touch sensor signal output terminals 25 via the second connection lines 24.

Parts of the second connection lines 24 between the touch sensor lines 14 and the touch sensor inspection patterns 22 are formed in the same layer as that of the touch sensor lines 14, i.e., the third line layer. On the other hand, among parts of the second connection lines 24 between the touch sensor inspection patterns 22 and the touch sensor signal output terminals 25, the parts of some of the lines are formed in the same layer as that of the gate lines 12, i.e., the first line layer, and the parts of the other lines are formed in the same layer as that of the source lines 13, i.e., the second line layer. Here, among the parts of the second connection lines 24 between the touch sensor inspection patterns 22 and the touch sensor signal output terminals 25, the parts of the second connection lines 24 formed in the first line layer are referred to as "second connection lines 24a", and the parts of the second connection lines 24 formed in the second line layer are referred to as "second connection lines 24b". Further, the parts of the second connection lines 24 formed in the third line layer are referred to as "second connection lines 24c".

In a case where there is no need to distinguish the second connection lines 24a, the second connection lines 24b, and the second connection lines 24c, they are referred to generally as the "second connection lines 24".

In other words, in the touch sensor inspection patterns 22, the second connection lines 24c connected with the touch sensor lines 14 are reconnected to the second connection lines 24a formed in the first line layer, or to the second connection lines 24b formed in the second line layer.

In FIG. 3, the lines formed in the first line layer, the lines formed in the second line layer, and the lines formed in the third line layer are distinctly illustrated by widths of the lines. More specifically, the illustration is made in such a manner that the line width increases in the ascending order of the lines formed in the third line layer, the lines formed in the first line layer, and the lines formed in the second line layer.

The second connection lines 24a and the second connection lines 24b are alternately arranged. In other words, one of two adjacent second connection lines 24c is connected with the second connection line 24a, and the other of the two is connected with the second connection line 24b.

The connection lines such as the first connection lines 21 and the second connection lines 24 are called lead-out lines in some cases.

As illustrated in FIG. 3, the touch sensor inspection patterns 22 are formed in the sealing area 20, that is, a region where the counter substrate 2 opposed to the active matrix substrate 1 is present. In other words, the second connection lines 24c formed in the third line layer are not formed in a region where the counter substrate 2 is not present. On the other hand, the second connection lines 24a formed in the first line layer and the second connection lines 24b formed in the second line layer are formed also in the region where the counter substrate 2 is not present, as illustrated in FIG. 3.

As is described below with reference to FIG. 4, the third line layer in which the second connection lines 24c are formed is positioned farthest from the glass substrate of the active matrix substrate 1, farther as compared with the first line layer and the second line layer. Since a second insulating film 55 (see FIG. 4) is the only insulating film that protects the second connection lines 24c, there is a concern that corrosion of lines could occur if the second connection lines 24c are formed in the region where the counter substrate 2 is not present. Further, in a case where a driving circuit 11 is mounted and thereafter the driving circuit 11 has to be replaced due to a defect or the like thereof, the second connection lines 24c, if formed in the region where the counter substrate 2 is not present, tend to be broken.

In the present embodiment, however, since the second connection lines 24c are not formed in the region where the counter substrate 2 is not present, the occurrence of defects such as corrosion of lines or breakage as described above can be suppressed. Further, since adjacent ones of the second connection lines 24c are reconnected alternately to the second connection lines 24a and the second connection lines 24b that are formed in the different layers, respectively, the line widths and the spaces between lines can be increased as compared with a case where the second connection lines 24c are reconnected to only the second connection lines 24a, or the second connection lines 24b. This makes it possible to reduce disconnections or short circuits, thereby increasing the yield at the time of manufacture.

On the other hand, since the second connection lines 24a formed in the first line layer and the second connection lines 24b formed in the second line layer are protected by the first insulating film 53, the flattening film 54, and the second insulating film 55 (see FIG. 4), it is less likely that defects such as corrosion of lines or breaking as described above would occur to the second connection lines 24a and 24b, even if they are formed in the region where the counter substrate 2 is not present.

The reconnection of the second connection lines 24c to the second connection lines 24a or the second connection lines 24b is made in the sealing area 20, but it may be made between the sealing area 20 and the display area 10.

Further, the configuration may be such that the second connection lines 24c formed in the third line layer are reconnected only to the second connection lines 24a formed in the first line layer, or alternatively, may be such that the same are reconnected only to the second connection lines 24b formed in the second line layer. The layer of the lines to which the second connection lines 24c are reconnected can be appropriately determined depending on the number of the second connection lines 24, the size of the driving circuit 11, and the outer shape of the liquid crystal display (the size of the frame area). For example, as is described later with reference to FIG. 4, since there are more protection layers for the second connection lines 24a formed in the first layer, as compared with the second connection lines 24b formed in the second line layer, the concern of corrosion of lines and the like can be reduced, in a case where the second connection lines 24c are reconnected only to the second connection lines 24a.

As described above, the touch sensor inspection patterns 22 are formed in the sealing area 20, that is, the area where the counter substrate 2, opposed to the active matrix substrate 1, is provided. In an area on the counter substrate 2 side opposed to the area where the touch sensor inspection patterns 22 are formed, a black matrix is provided. When the touch sensor lines 14 are inspected regarding a disconnection or a short circuit, the driving circuit 11 has not been mounted yet, and a plurality of switching elements (inspection TFTs) included in the touch sensor inspection patterns 22 are not covered with a driving circuit chip. In a case where, therefore, a black matrix is not provided in an area on the counter substrate 2 side, opposed to the area where the touch sensor inspection pattern 22 is formed, there is a possibility that external light is incident on the switching elements (inspection TFTs) and causes properties of the switching elements to fluctuate, depending on inspection environments. In the present embodiment, however, the black matrix is provided in the area on the counter substrate 2 side, opposed to the area where the touch sensor inspection pattern 22 is formed, which makes it possible to suppress fluctuations of the properties of the switching elements during inspection.

FIG. 4 is a cross-sectional view illustrating the sealing area 20 in an area where the first connection lines 21a, the first connection lines 21b, and the second connection lines 24c are arranged. On the glass substrate 51 of the active matrix substrate 1, the first connection lines 21a are formed. The first connection lines 21a are formed in the same layer as that of the gate lines 12 and the gate electrodes, i.e., the first line layer.

The gate insulating film 52 is formed so as to cover the first connection lines 21a. The gate insulating film 52 is made of, for example, silicon nitride (SiNx), or silicon oxide (SiOx).

On the gate insulating film 52, the first connection lines 21b are formed. The first connection lines 21b are formed in the same layer as that of the source lines 13 and the source electrodes, that is, the second line layer.

The first insulating film 53 is formed so as to cover the first connection lines 21b. The first insulating film 53 is made of, for example, silicon nitride (SiNx) or silicon oxide (SiOx).

On the first insulating film 53, the flattening film 54, which is an insulating film, is formed. The flattening film 54 is an organic film, and is made of, for example, an acrylic resin material having photosensitivity. The flattening film 54 is preferably made of a material having a low relative dielectric constant (for example, 2 to 4), and is formed to be thick (for example, 1 to 4 µm), so that the electrostatic capacitances between the flattening film 54 and the first connection lines 21a, the first connection lines 21b, as well as the second connection lines 24 can be reduced.

On the flattening film 54, the second connection lines 24c are formed.

The second insulating film 55 is formed so as to cover the second connection lines 24. The second insulating film 55 is made of, for example, silicon nitride (SiNx) or silicon oxide (SiOx). In the display area 10, the counter electrodes 31 are formed on the second insulating film 55. The counter electrodes 31 are connected with the touch sensor lines 14 through contact holes formed in the second insulating film 55. Further, the pixel electrodes formed in the display area 10 are formed on the flattening film 54, and are covered with the second insulating film 55, as is the case with the second connection lines 24c.

On the second insulating film 55, the sealing member 3 is provided. In FIG. 4, the illustration of spacers arranged in the sealing area 20 is omitted.

The counter substrate 2 is provided on a side opposite to the active matrix substrate 1, with the sealing member 3 being interposed therebetween. On the glass substrate 56 of the counter substrate 2, the black matrix 57 is formed, and an overcoat layer 58 is formed between the black matrix 57 and the sealing member 3. In the display area 10 of the counter substrate 2, color filters (not shown) are formed.

Figure 5:
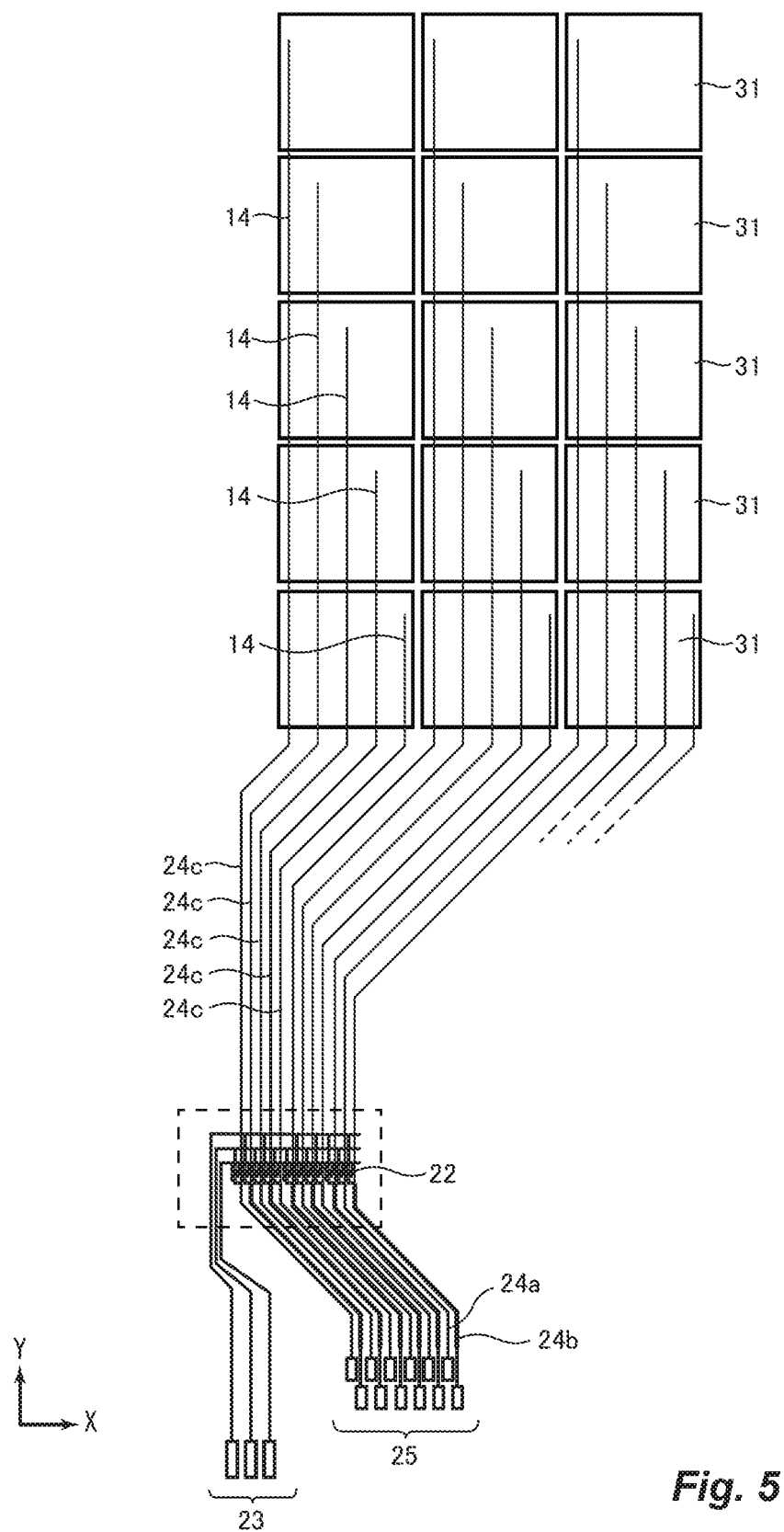
FIG. 5 is a partial enlarged view illustrating a part that includes a counter electrode, touch sensor lines, touch sensor inspection patterns, touch sensor inspection signal input terminals, and touch sensor signal output terminals.
Figure 6:
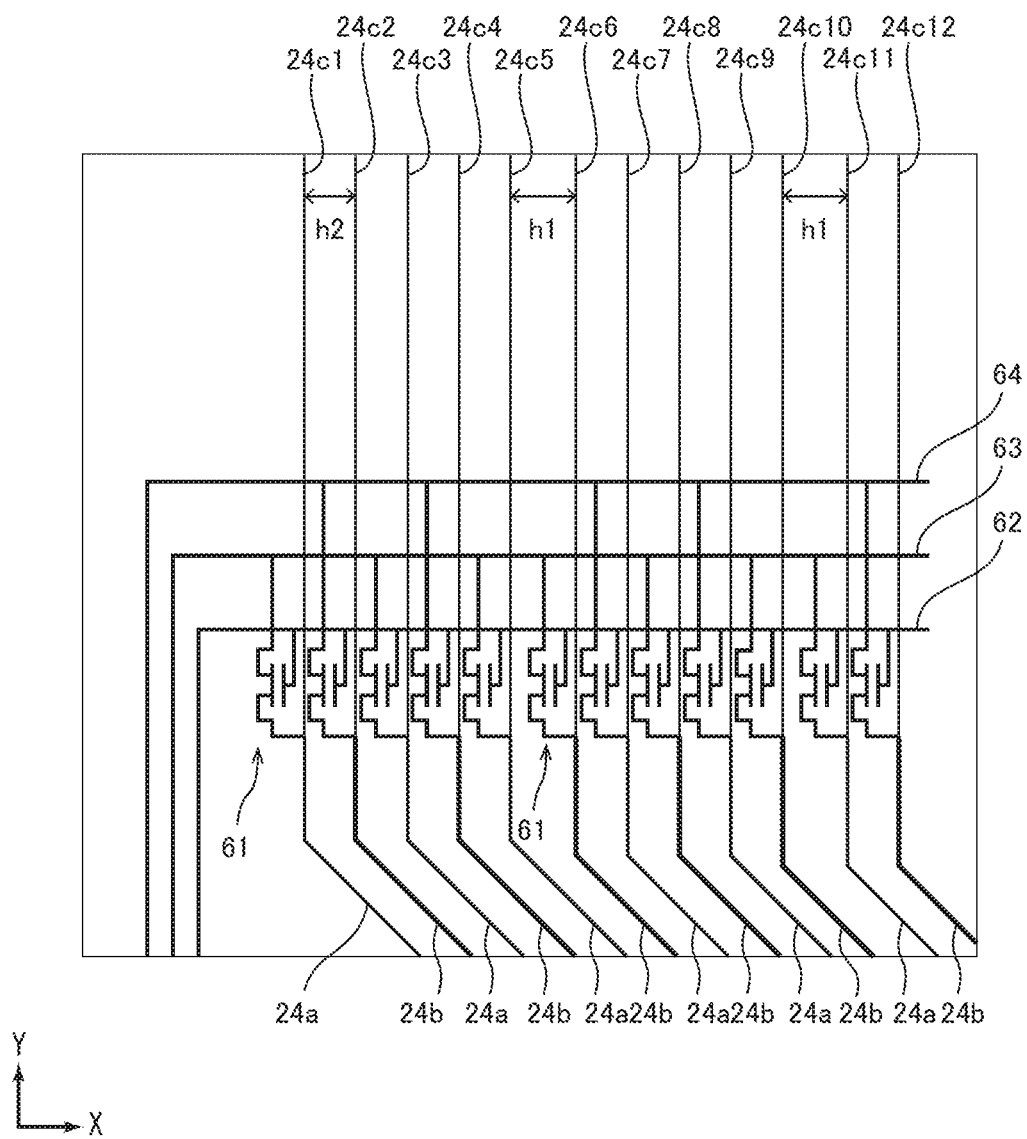
FIG. 6 is an enlarged view illustrating an area surrounded by a dotted line in FIG. 5.

FIG. 5 is a partial enlarged view illustrating a part that includes the counter electrodes 31, the touch sensor lines 14, the second connection lines 24, the touch sensor inspection patterns 22, the touch sensor inspection signal input terminals 23, and the touch sensor signal output terminals 25. Further, FIG. 6 is an enlarged view illustrating an area surrounded by the dotted line in FIG. 5.

The touch sensor inspection pattern 22 is provided with a plurality of switching elements 61 (switching elements for second connection line) (hereinafter referred to as an "inspection TFTs 61"). The inspection TFT 61 has a gate electrode connected with a turning ON/OFF control line 62, and a source electrode connected with a common line, which is either one of a first common line 63 and a second common line 64. The inspection TFT 61 has a drain electrode connected with the second connection line 24. More specifically, the drain electrode of the inspection TFT 61 is connected with the second connection line 24c, and either the second connection line 24a or the second connection line 24b.

The first common line 63 and the second common line 64 are lines for inputting the touch sensor inspection signal. Among the second connection lines 24 connected with the counter electrodes 31 arranged in the same column through the touch sensor lines 14, one of adjacent ones of the second connection lines 24 is connected to the first common line 63 through the inspection TFT 61, and the other one of the same are connected to the second common line 64 through the inspection TFT 61.

Figure 7:
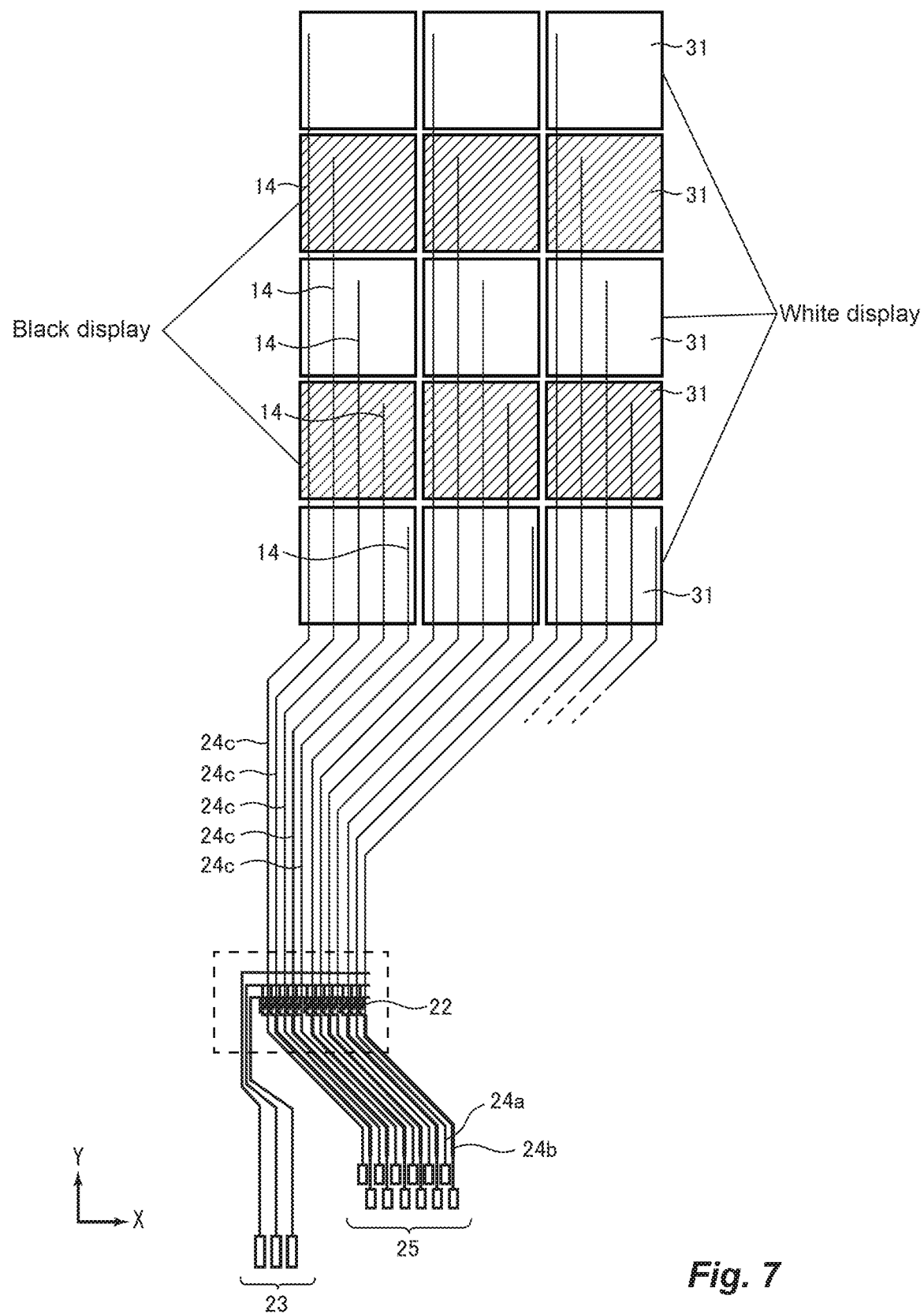
FIG. 7 illustrates an exemplary display of a stripe pattern as an exemplary specific pattern.

The following description describes an exemplary inspection method for detecting a disconnection or a short circuit the touch sensor lines 14 and the second connection lines 24. First of all, a signal for turning on all of the inspection TFTs 61 through the turning ON/OFF control lines 62, and applies a voltage to the counter electrodes 31 through the first common lines 63 or the second common lines 64, so that a specific pattern is displayed. The specific pattern is, for example, a stripe pattern that displays white and black alternately row by row, as illustrated in FIG. 7. In the case where a stripe pattern as illustrated in FIG. 7 is displayed, a signal for white display is supplied through the first common line 63, and a signal for black display is supplied through the second common line 64. Here, the signal for white display is a signal for causing light from a light source (backlight) arranged on a back surface of the display device (on the side of the glass substrate of the active matrix substrate 1) to pass through, and the signal for black display is a signal for causing light from the light source not to pass through. Further, when this inspection operation is executed, a reference potential is supplied to the pixel electrodes using the gate drivers 15 and the source line inspection pattern 18.

Thereafter, by visual inspection by an inspector, or by image processing, it is determined whether or not the specific pattern is normally displayed. If the specific pattern is displayed, it is determined that no disconnection nor short circuit has occurred to the touch sensor lines 14 and the second connection lines 24. On the other hand, if the specific pattern is not normally displayed, it is determined that a disconnection or a short circuit has occurred to the touch sensor lines 14 and/or the second connection lines 24.

Here, in a case where an odd number of the counter electrodes 31 is arranged in one column, some of the adjacent ones of the second connection lines 24 are connected to the same common line via the inspection TFTs 61. More specifically, among the adjacent ones of the second connection lines 24, some second connection lines 24 connected with the counter electrodes 31 arranged in different columns through the touch sensor lines 14 are connected with the same common line among the first common lines 63 and the second common lines 64 through the inspection TFTs 61.

For example, as illustrated in FIG. 5, in a case where the number of the counter electrodes 31 arranged in one column is five, the second connection line 24c5 and the second connection line 24c6 are both connected with the first common line 63 through the inspection TFTs 61. Further, the second connection line 24c10 and the second connection line 24c11 are both connected with the first common line 63 through the inspection TFTs 61.

When two adjacent ones that are connected to different common lines, of the second connection lines 24c, are short-circuited, pixels that should have had different displays have the same display, which allow a short circuit to be detected.

On the other hand, when two adjacent ones that are connected to the same common line, of the second connection lines 24c, are short-circuited, the display is the same display as that of the normal display case in which no short circuit occurs, and a short circuit cannot be detected. For example, in the example illustrated in FIG. 6, since the second connection line 24c5 and the second connection line 24c6 are connected through the inspection TFTs 61 to the first common line 63, the display when the second connection line 24c5 and the second connection line 24c6 are short-circuited is the same display in a case no short circuit occurs.

In the present embodiment, therefore, a space between two adjacent ones of the second connection lines 24c connected to the same common line is set to be wider than a space between two adjacent ones of the second connection lines 24c connected to different common lines. In one example, the space between two adjacent ones of the second connection lines 24c connected to different common lines is set to 10 μm, while the space between two adjacent ones of the second connection lines 24c connected to the same common line is set to 20 μm.

In the example illustrated in FIG. 6, the second connection line 24c5 and the second connection line 24c6, which are adjacent to each other, are connected to the same common line (the first common line 63), and the second connection line 24c10 and the second connection line 24c11 are connected to the same common line (the first common line 63). The space h1 between the second connection line 24c5 and the second connection line 24c6, and the space h1 between the second connection line 24c10 and the second connection line 24c11, are set to be wider than a space h2 between other adjacent ones of the second connection lines 24c (for example, the space between the second connection line 24c1 and the second connection line 24c2). In the present embodiment, the spaces h2 between two adjacent ones of the second connection lines 24c connected to the different common lines are all equal. The spaces h2 between two adjacent ones of the second connection lines 24c connected to the different common line, however, may be different from one another.

By setting wider the space between two adjacent ones of the second connection lines 24c connected to the same common line, the occurrence of a short circuit can be suppressed. With this, defective products, having undetected short circuits, are prevented from being distributed.

Figure 8:
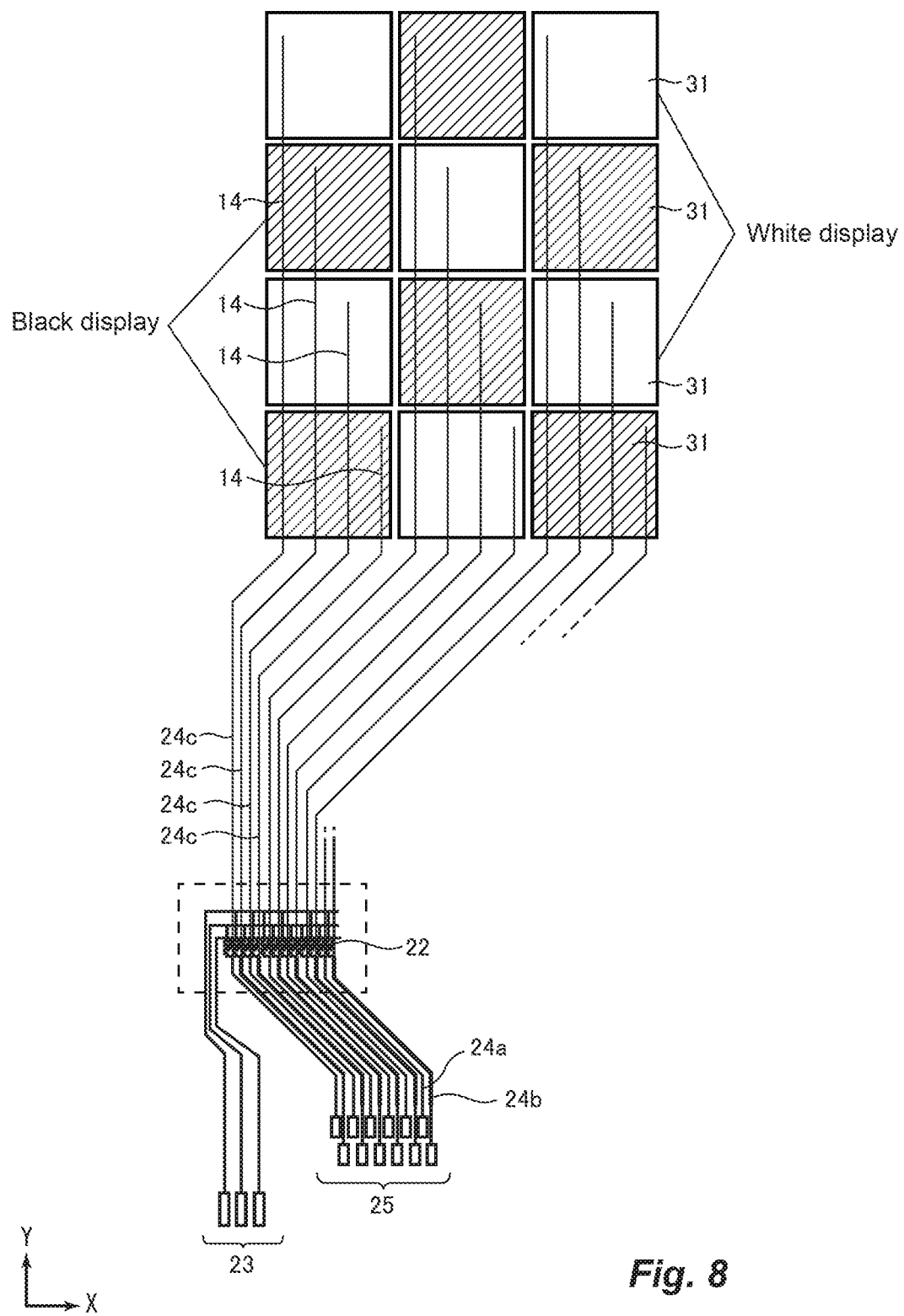
FIG. 8 illustrates an exemplary display of a checkered pattern as another exemplary specific pattern.

FIG. 8 illustrates an exemplary display of a checkered pattern as another exemplary specific pattern. In the specific pattern illustrated in FIG. 8, the pixels are in such a checkered pattern that the pixels corresponding to either one of two adjacent ones in any direction of the row direction and the column direction displays white, and the pixels corresponding to the other display black display.

In a case where the specific pattern for inspection is a checkered pattern, an even number of the counter electrodes 31 are arranged in one column, some are connected through the inspections TFT 61 to the same common line, among adjacent ones of the second connection line 24. More specifically, among pairs of adjacent two second connection lines 24, the second connection lines 24 connected to the counter electrodes 31 arranged in the different rows through the touch sensor lines 14 are connected to the same common line, which is either the first common line 63 or the second common line 64, through the inspection TFTs 61.

Figure 9:
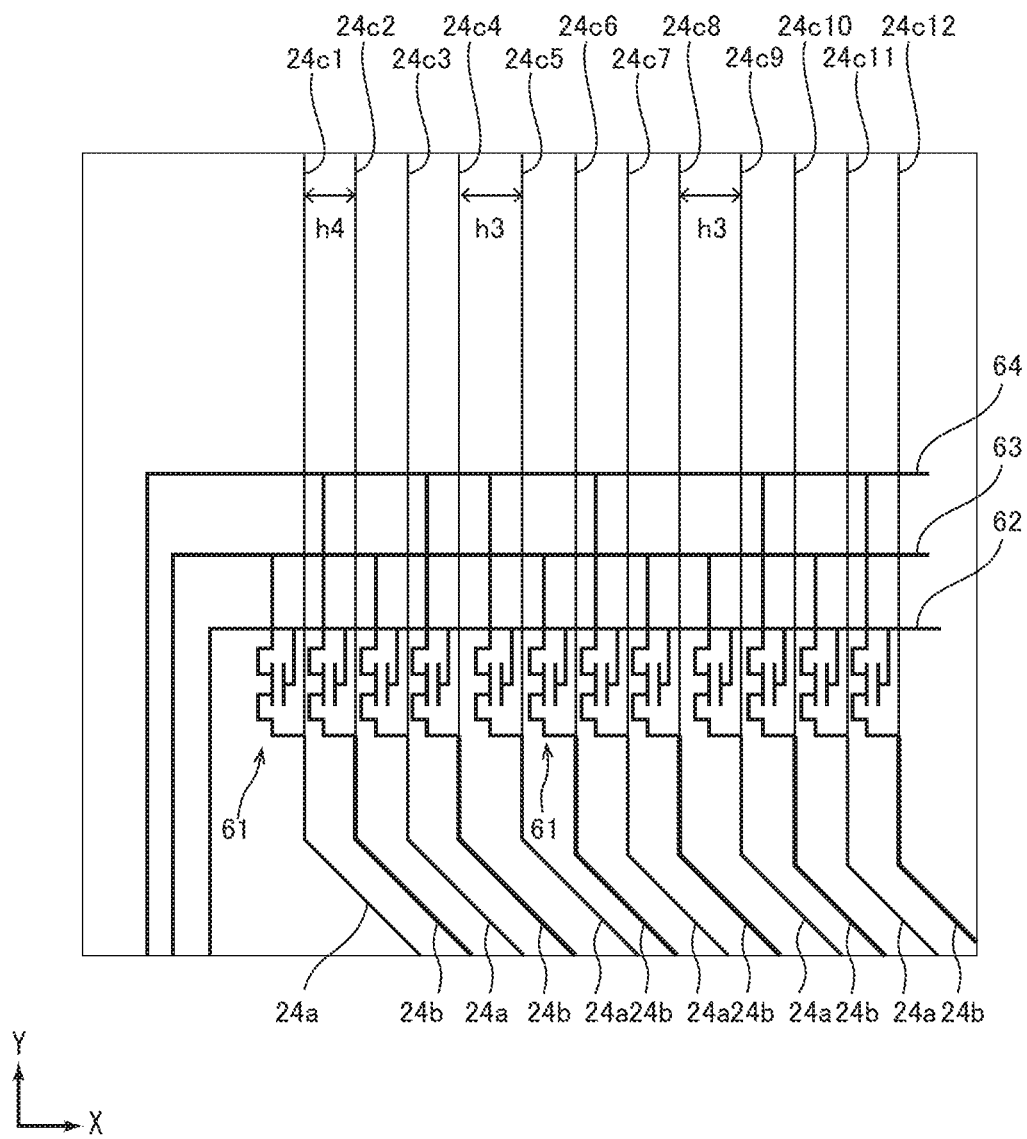
FIG. 9 is an enlarged view illustrating an area surrounded by a dotted line in FIG. 8.

FIG. 9 is an enlarged view illustrating an area surrounded by the dotted line in FIG. 8. As illustrated in FIG. 8, in a case where the number of the counter electrodes 31 arranged in one column is four, the second connection line 24c4 and the second connection line 24c5 are both connected with the second common line 64 through the inspections TFT 61.

In this case as well, a space between two adjacent ones of the second connection lines 24c connected to the same common line is set to be wider than a space between two adjacent ones of the second connection lines 24c connected to different common lines. In the example illustrated in FIG. 9, the space h3 between the second connection line 24c4 and the second connection line 24c5, and the space h3 between the second connection line 24c8 and the second connection line 24c9, are set to be wider than a space h4 between other adjacent ones of the second connection lines 24c (for example, the space h2 between the second connection line 24c1 and the second connection line 24c2).

With such a configuration, even in a case where the specific pattern is a checkered pattern, the occurrence of a short circuit between two adjacent ones of the second connection lines 24c connected to the same common line can be suppressed. With this, defective products, having undetected short circuits, are prevented from being distributed.

Incidentally, in order to display a stripe pattern or a checkered pattern, only two common lines, i.e., the first common line 63 and the second common line 64, may be sufficient, as described above. If the common lines are increased in number, however, various patterns can be displayed as specific patterns, which allows the inspection accuracy to improve. For example, if the common lines are increased to four, a short circuit between adjacent lines formed in the same line layer can be detected. On the other hand, if the common lines are increased in number, areas for arranging the same have to be ensured, and there is a possibility that the frame cannot be made narrower or the layout regarding the connection line width becomes difficult. The number of the common lines, therefore, is appropriately set according to the FPC terminal area, the outer shape of the liquid crystal display (the size of the frame area), and the like.

Embodiment 2

Figure 10:
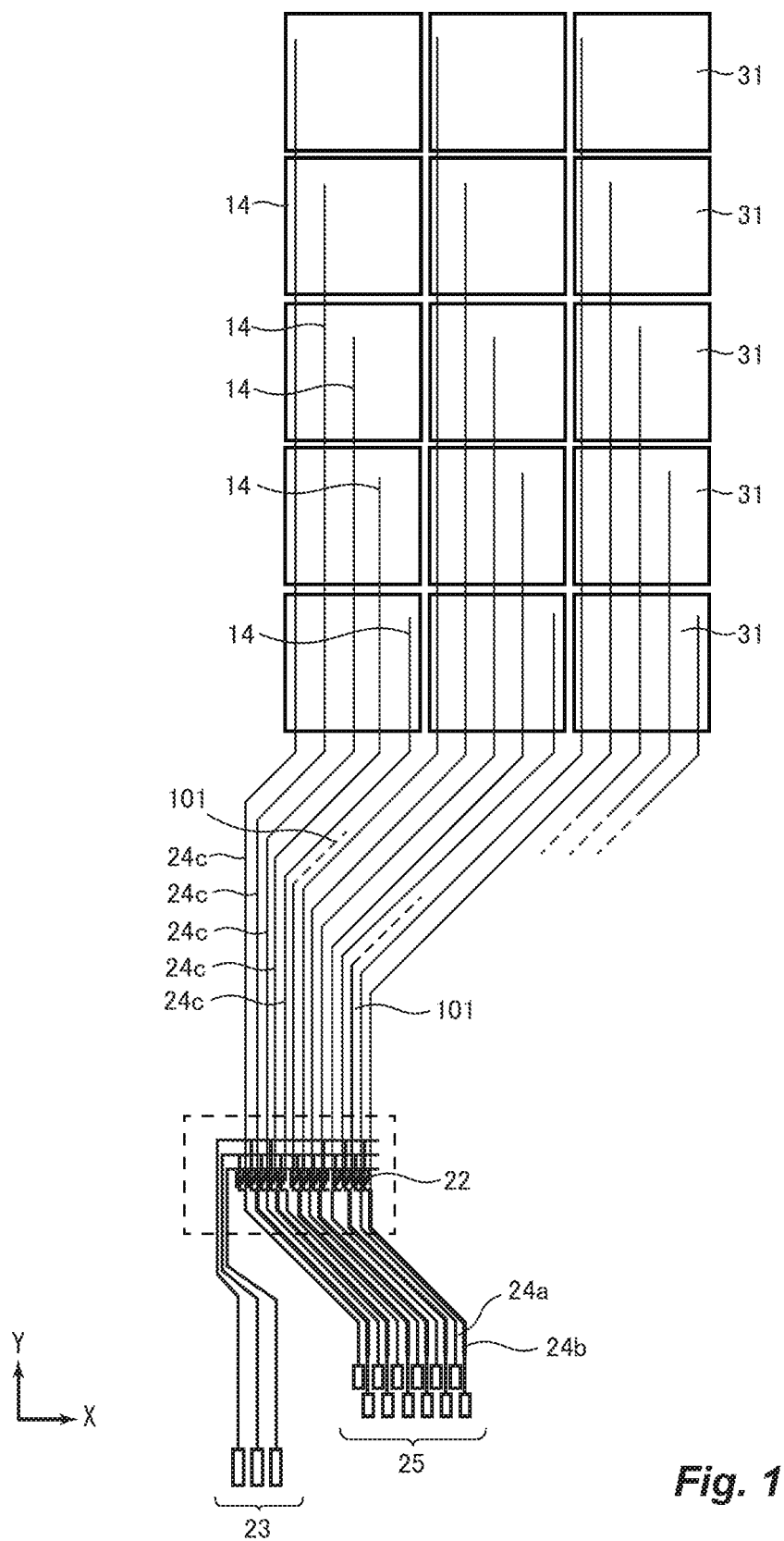
FIG. 10 is a partial enlarged view illustrating a part that includes a counter electrode, touch sensor lines, touch sensor inspection patterns, touch sensor inspection signal input terminals, and touch sensor signal output terminals in Embodiment 2.
Figure 11:
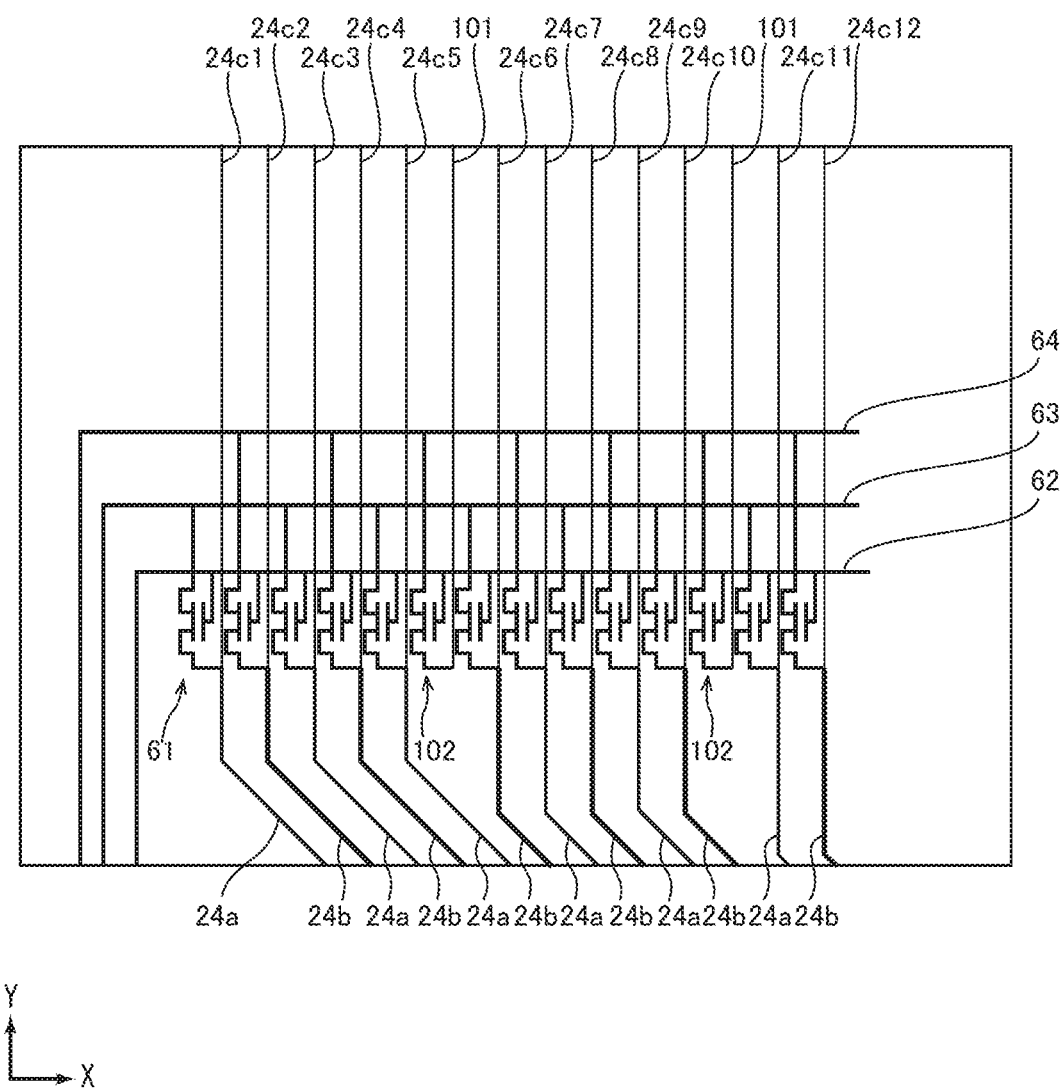
FIG. 11 is an enlarged view illustrating an area surrounded by a dotted line in FIG. 10.

FIG. 10 is a partial enlarged view illustrating a part that includes counter electrodes 31, touch sensor lines 14, second connection lines 24, a touch sensor inspection pattern 22, touch sensor inspection signal input terminals 23, and touch sensor signal output terminals 25 in Embodiment 2. Further, FIG. 11 is an enlarged view illustrating an area surrounded by the dotted line in FIG. 10. The following description describes an example in which a disconnection or a short circuit of the touch sensor lines 14 and the second connection lines 24 is detected by displaying a stripe pattern.

In the present embodiment, a dummy connection line 101 is arranged between two adjacent ones connected the same common line, of the second connection lines 24c. One end of each dummy connection line 101 is connected to a dummy inspection TFT 102, and the other end thereof is not connected to anywhere. In other words, the dummy connection lines 101 are not connected to the counter electrodes 31.

In the example illustrated in FIG. 11, both of the second connection line 24c5 and the second connection line 24c6, which are adjacent to each other, are connected to the first common line 63. Between the second connection line 24c5 and the second connection line 24c6, therefore, the dummy connection line 101 is arranged. One end of the dummy connection line 101 is connected to the drain electrode of the dummy inspection TFT 102. The gate electrode of the dummy inspection TFT 102 is connected with a turning ON/OFF control line 62, and the source electrode thereof is connected with a second common line 64.

The space between the dummy connection line 101 and the second connection line 24c5, and the space between the dummy connection line 101 and the second connection line 24c6 can be set equal to a space between adjacent two of the second connection lines 24c. These spaces, however, may be different.

The dummy inspection TFT 102 is arranged between the inspection TFT 61 connected with the second connection line 24c5, and the inspection TFT 61 connected with the second connection line 24c6. The source electrode of the dummy inspection TFT 102 is connected with a common line (a second common line 64) that is different from a common line (a first common line 63) to which the inspection TFT 61 connected with the second connection line 24c5 adjacent to the dummy inspection TFT 102 and the inspection TFT 61 connected with the second connection line 24c6 adjacent to the dummy inspection TFT 102.

Incidentally, both of the second connection line 24c10 and the second connection line 24c11, which are adjacent to each other, are connected to the first common line 63. Between the second connection line 24c10 and the second connection line 24c11, therefore, a dummy connection line 101 is arranged, too.

In the configuration of the present embodiment, if a short circuit occurs to between the second connection line 24c5 and the second connection line 24c6 via the dummy connection line 101 causes a change in the display of the specific pattern (stripe pattern) when it is displayed, as compared with the display before the short circuit occurs, whereby the short circuit can be detected. In other words, when the second connection line 24c5 and the second connection line 24c6 are short-circuited via the dummy connection line 101, a signal indicating a gray level that is intermediate between black and white is supplied to the counter electrodes 31 that are connected through the second connection line 24c5 and the second connection line 24c6. Thereby, though the second connection line 24c5 and the second connection line 24c6 are connected with the first common line 63 through the inspection TFTs 61, gray color, which is intermediate between white and black, is displayed on the pixels corresponding to the counter electrodes 31 to which the second connection line 24c5 and the second connection line 24c6 are connected. This allows a short circuit between the second connection line 24c5 and the second connection line 24c6 to be detected.

Further, by arranging the dummy connection line 101 between two adjacent ones of the second connection lines 24c connected to the same common line, the space between the two adjacent second connection lines connected to the same common line can be widened, whereby the occurrence of a short circuit between the two second connection lines can be suppressed. Here, even if the dummy connection line 101 and one of the two adjacent ones of the second connection lines 24c are short-circuited, no defect occurs to the second connection line 24c.

Incidentally, the source electrode of the dummy inspection TFT 102 is connected with a common line (the second common line 64) different from the common line (the first common line 63) to which the inspection TFT 61 connected with the second connection line 24c5 adjacent thereto and the inspection TFT 61 connected with the second connection line 24c6 adjacent thereto are connected, but the source electrode of the dummy inspection TFT 102 may be connected with another additionally provided signal line, so that a signal exclusive for the same may be input thereto.

In the foregoing description, an example is described in which the specific pattern displayed in the inspection is a stripe pattern, but the same applies to a case where the specific pattern is a checkered pattern or a case where it is another display pattern. In other words, the configuration may be such that a dummy connection line is arranged between two adjacent ones of the second connection lines 24c connected to the same common line, and a dummy inspection TFT connected with the dummy connection line may be arranged.

Embodiment 3

Figure 12:
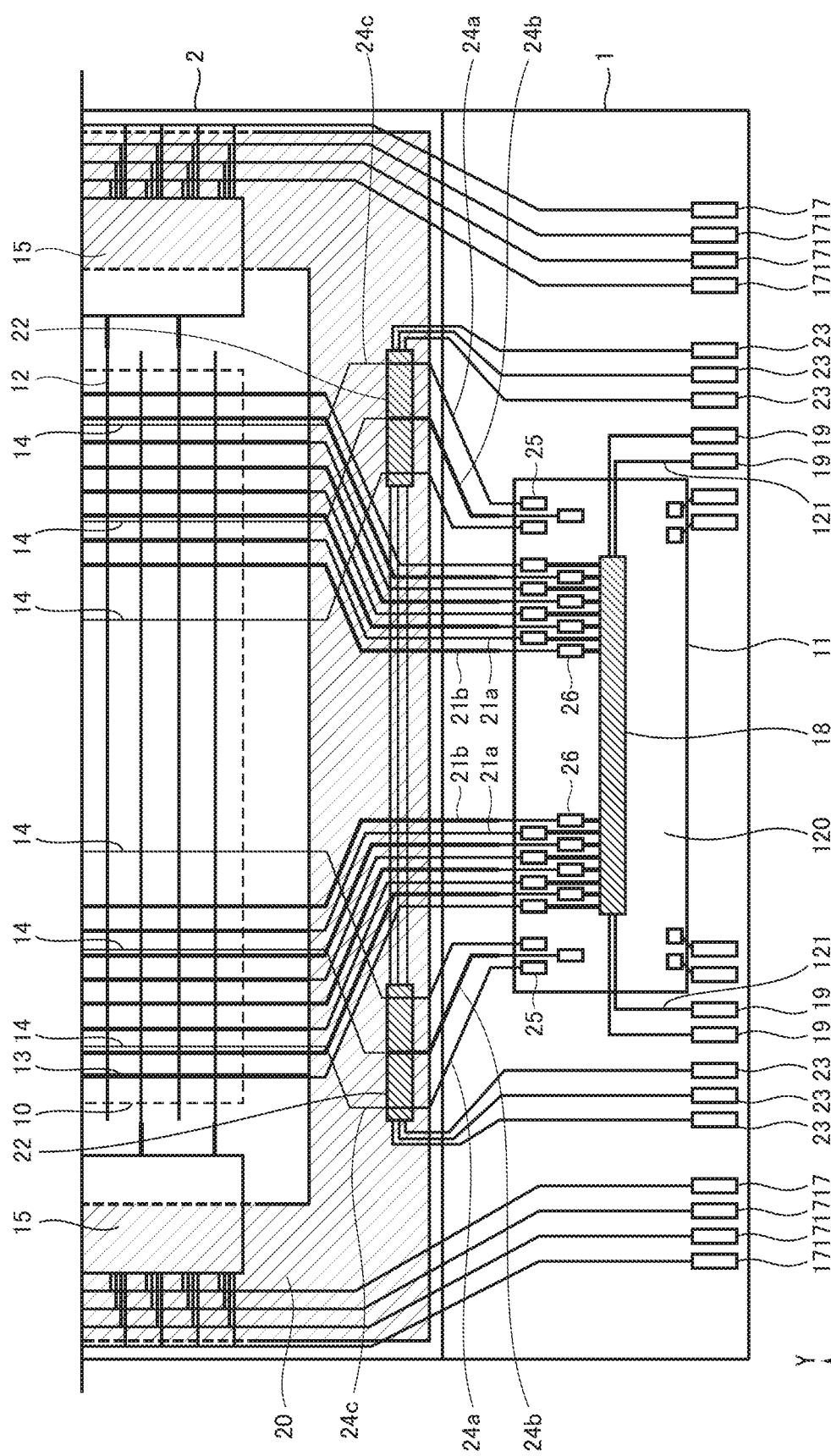
FIG. 12 is a plan view illustrating a position at which a source line inspection pattern is arranged, in Embodiment 3.

FIG. 12 is a plan view illustrating a position at which a source line inspection pattern 18 is arranged, in Embodiment 3. In Embodiment 1, the source line inspection pattern 18 is formed inside the sealing area 20, but in the present embodiment, the same is formed in an area 120 where the driving circuit 11 is mounted. More specifically, the source line inspection pattern 18 is formed on a side opposite to the first connection lines 21a,21b with respect to the source line signal output terminals 26, so that the source line signal output terminals 26 are interposed therebetween.

According to the configuration in which the source line inspection pattern 18 is provided in the area 120 where the driving circuit 11 is mounted, there is no need to arrange the source line inspection pattern 18 in an area close to the display area 10, which makes it possible to reduce the frame area. Besides, there is no need to arrange, in the sealing area 20, lines 121 for connecting the source line inspection pattern 18 and the source line inspection signal input terminal 19 with each other, which makes it possible to improve the degree of freedom in the layout of the connection lines (the first connection lines 21a,21b, the second connection lines 24c).

In a case where the source line inspection pattern 18 is formed in an area close to the display area 10 as illustrated in FIG. 3, there is a part in which a disconnection of the connection lines cannot be detected (the space between the source line inspection pattern 18 and the source line signal output terminals 26). With the configuration of the present embodiment, however, a disconnection of the connection lines between the source line inspection pattern 18 and the source line signal output terminals 26 can be detected.

Modification Configuration 1 of Embodiment 3

Figure 13:
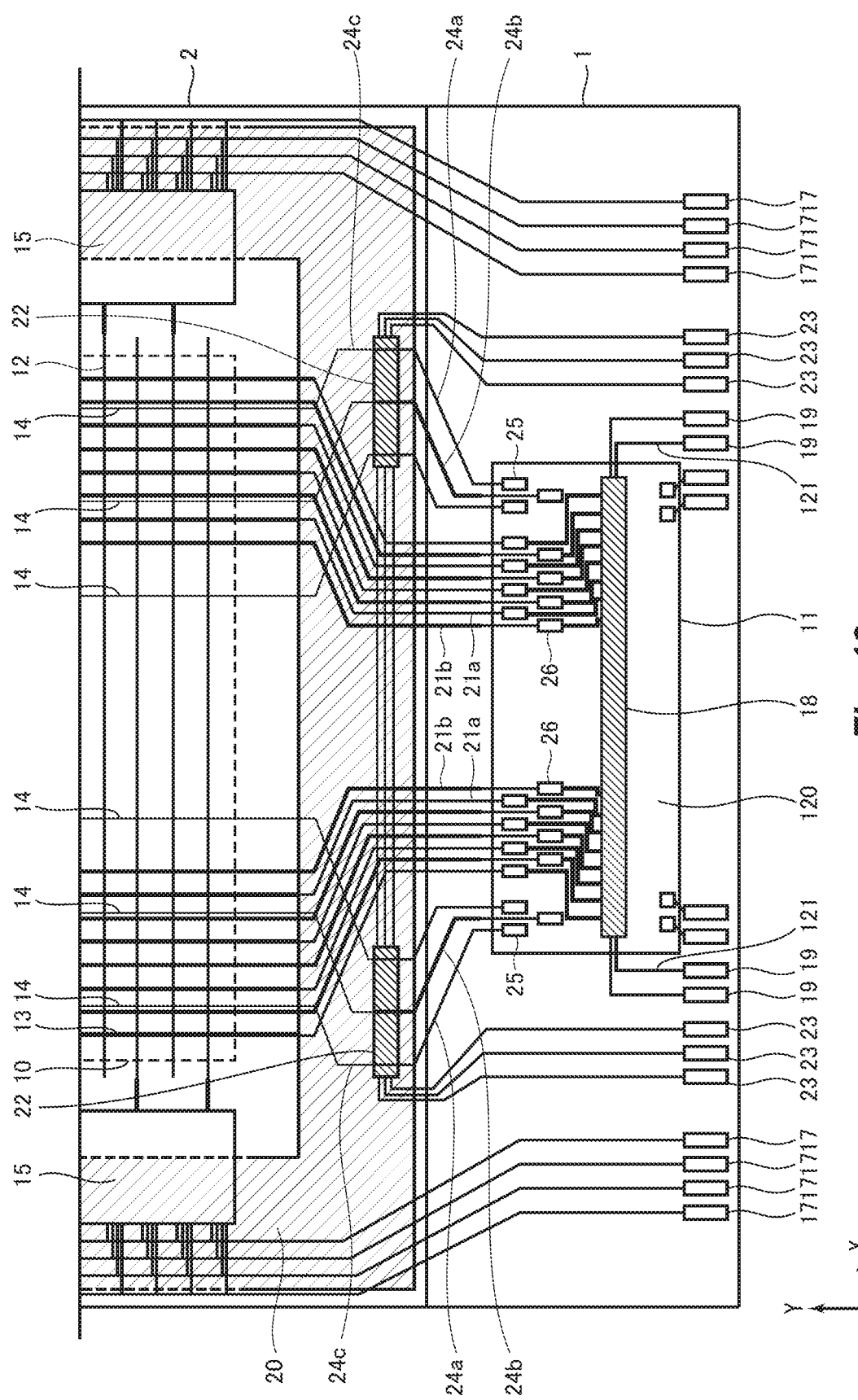
FIG. 13 is a plan view illustrating a position at which a source line inspection pattern is arranged, in Modification Configuration 1 of Embodiment 3.

FIG. 13 is a plan view illustrating a position at which a source line inspection pattern 18 is arranged, in Modification Configuration 1 of Embodiment 3. In FIG. 13, the same constituent portions as those in FIG. 3 are denoted by the same reference symbols, respectively. In this Modification Configuration 1, the source line inspection pattern 18 is formed on a side opposite to the first connection lines 21 and the second connection lines 24 with respect to the touch sensor signal output terminals 25 and the source line signal output terminals 26, so that the touch sensor signal output terminals 25 and the source line signal output terminals 26 are interposed therebetween. In other words, an area under the touch sensor signal output terminals 25 in the drawing (an area on a side opposite to the second connection lines 24a,24b with respect to the touch sensor signal output terminals 25) is also used, as an area where the source line inspection pattern 18 is arranged. This allows the source line inspection pattern 18 to be arranged in an area wider in the X axis direction, thereby making it possible to suppress a defect such as a disconnection and a short circuit inside the source line inspection pattern 18. Besides, this makes it possible to inspect a high-definition display device having a greater number of the source lines 13.

Modification Configuration 2 of Embodiment 3

Figure 14:
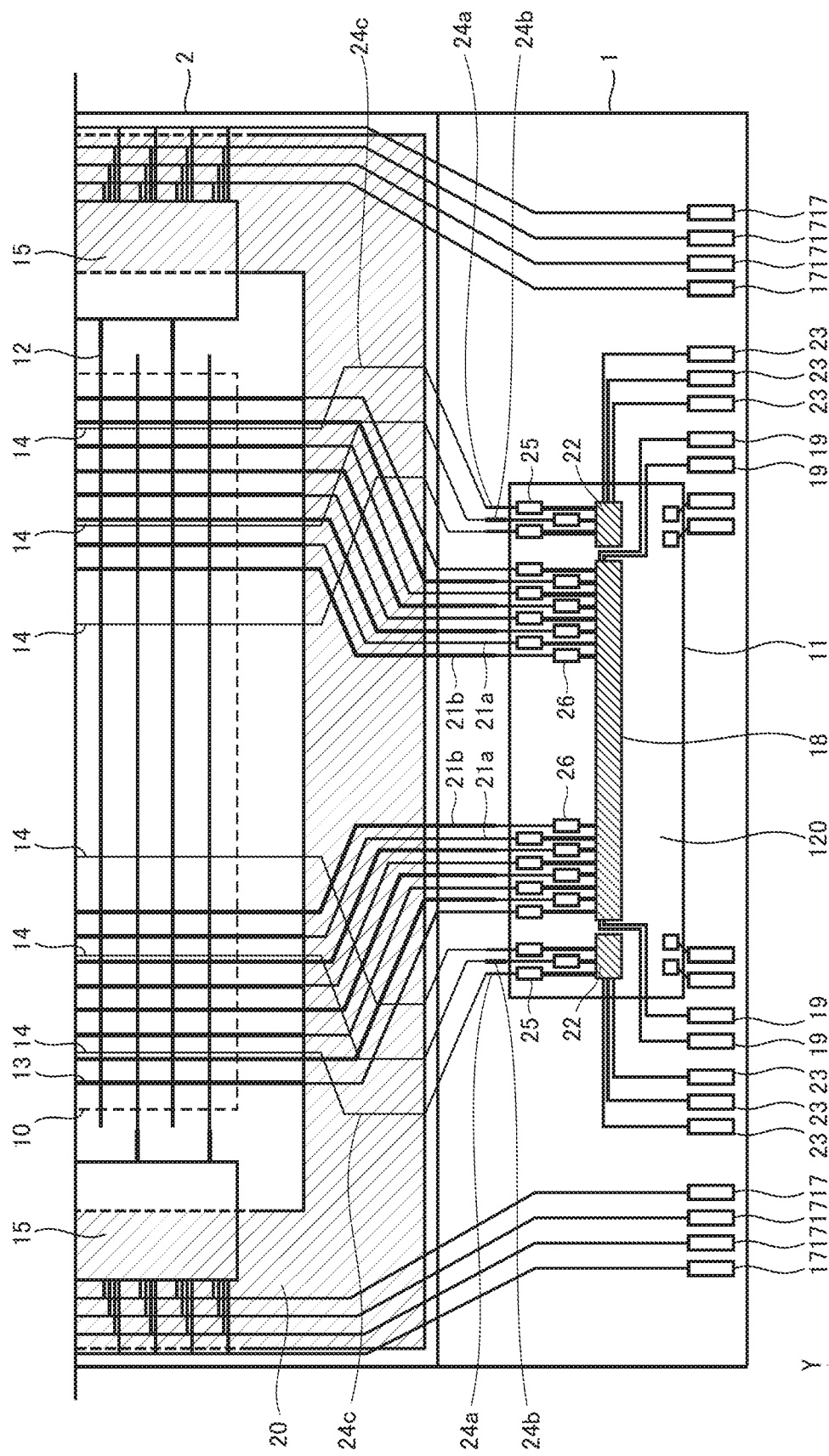
FIG. 14 is a plan view illustrating a position at which a source line inspection pattern and touch sensor inspection patterns are arranged, in Modification Configuration 2 of Embodiment 3.

FIG. 14 is a plan view illustrating a position at which a source line inspection pattern 18 and touch sensor inspection patterns 22 are arranged, in Modification Configuration 2 of Embodiment 3. In FIG. 14, the same constituent portions as those in FIG. 3 are denoted by the same reference symbols, respectively. In this Modification Configuration example, not only the source line inspection pattern 18 but also the touch sensor inspection patterns 22 are formed in the area 120 where the driving circuit 11 is mounted. More specifically, the touch sensor inspection patterns 22 are formed on a side opposite to the second connection lines 24a,24b with respect to the touch sensor signal output terminals 25. In other words, the second connection lines 24c are reconnected with the second connection lines 24a or the second connection lines 24b, in an area on a side opposite to the display area 10 with respect to the sealing area 20.

According to this configuration, the second connection lines 24c formed in the third line layer are reconnected, in the region where the counter substrate 2 is not present, to the second connection lines 24a formed in the first line layer, or to the second connection lines 24b formed in the second line layer. This makes it possible to ensure a wider area as an area where the first connection lines 21a,21b are formed, as compared with the configuration in which the second connection lines 24c are reconnected to the second connection lines 24a or the second connection lines 24b in the sealing area 20.

More specifically, in the configuration in which the second connection lines 24c are reconnected to the second connection lines 24a or the second connection lines 24b in the sealing area 20 (see FIG. 3), the second connection lines 24a exist in the first line layer, in which first connection lines 21a are formed, and the second connection lines 24b exist in the second line layer, in which the first connection lines 21b are formed. According to the configuration illustrated in FIG. 14, however, the second connection lines 24 arranged in the sealing area 20 are only the second connection lines 24c formed in the third line layer. This makes it possible to widen the spaces between the first connection lines 21a,21b and to reduce the frame area.

In a case where the source line inspection pattern 18 and the touch sensor inspection patterns 22 are formed in the area 120 where the driving circuit 11 is mounted, the area where they are formed is limited to the size of the driving circuit 11. In a case where the driving circuit 11 has a width narrower than the width of the display area 10, it is necessary to, for example, arrange the inspection TFTs 61 in a staggered manner over a plurality of rows.

Figure 15:
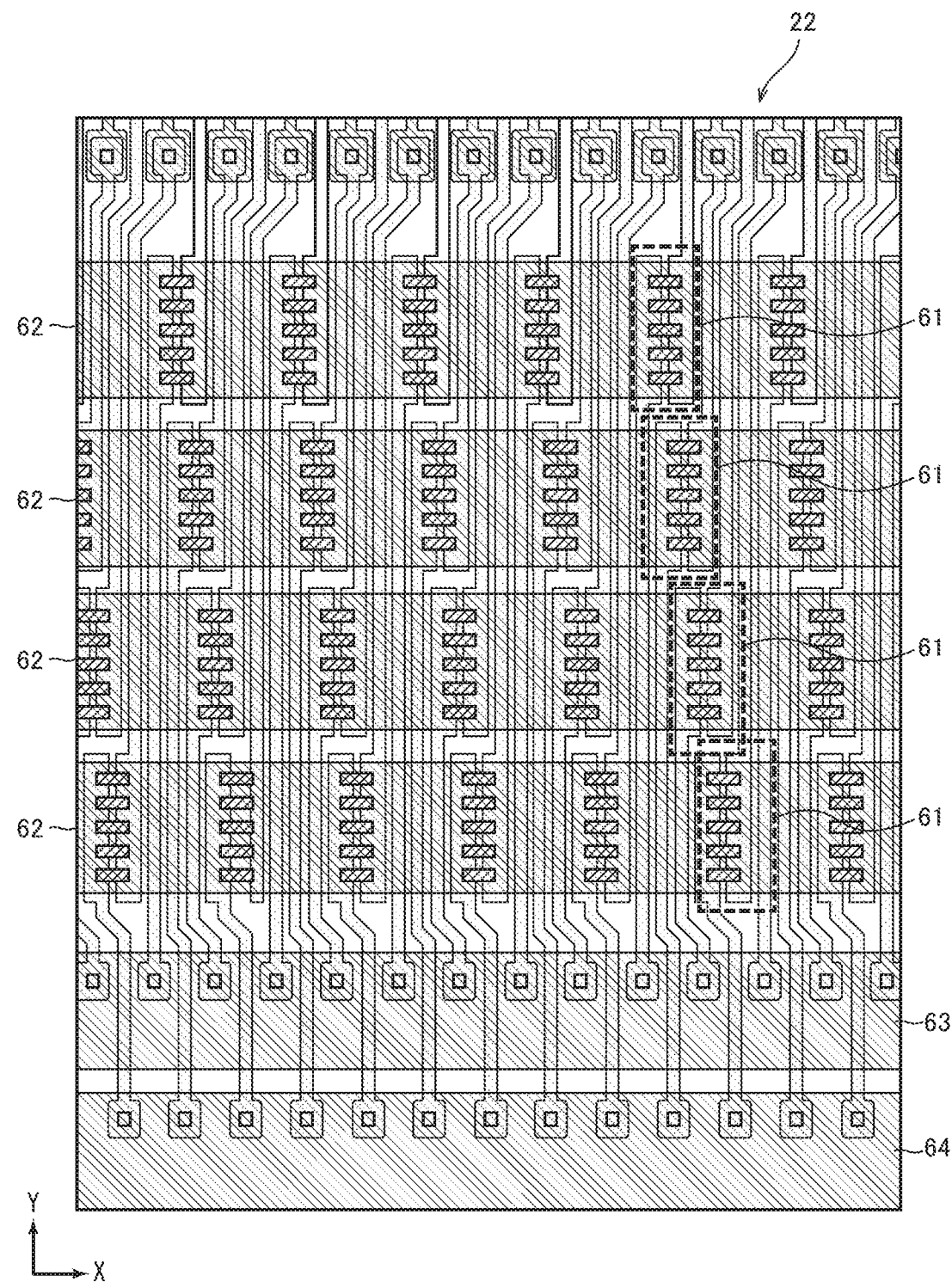
FIG. 15 is an enlarged view illustrating the touch sensor inspection pattern.

FIG. 15 is an enlarged view illustrating the touch sensor inspection pattern 22. In the example illustrated in FIG. 15, a plurality of inspection TFTs 61 included in the touch sensor inspection pattern 22 are arranged in a staggered manner over four rows. Though the illustration is omitted, a plurality of switching elements (inspection TFTs) included in the source line inspection pattern 18 are similarly arranged in a staggered manner over a plurality of rows.

Incidentally, in FIG. 15, four turning ON/OFF control lines 62 are provided, in correspondence to the inspection TFTs 61 arranged over four rows. These four turning ON/OFF control lines 62 may be tied up in a bundle in a place that is not illustrated.

Embodiment 4

Figure 16:
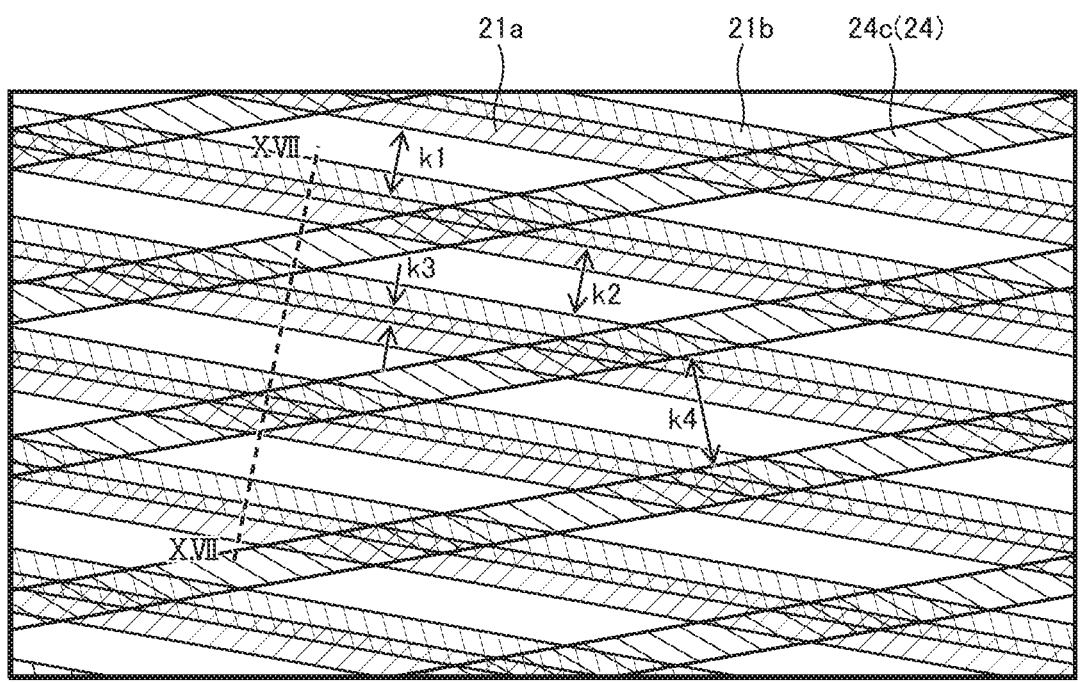
FIG. 16 is an enlarged plan view illustrating, in a sealing area, an area that includes areas where first connection lines and second connection lines are partially superposed, when viewed in a plan view, in Embodiment 4.
Figure 16:
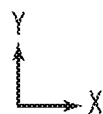

FIG. 16 is an enlarged plan view illustrating, in a sealing area 20, an area that includes areas where the first connection lines 21a,21b, and the second connection lines 24 are partially superposed, when viewed in a plan view, in Embodiment 4. In the present embodiment, in the sealing area 20, in each area where the first connection lines 21a and 21b, and the second connection line 24, are superposed on each other, the first connection lines 21a and the first connection line 21b, which are formed in different layers, respectively, are partially superposed when viewed in a plan view.

Here, the first connection line 21a has a line width of 3 μm, and a space k1 between the same and an adjacent one of the first connection lines 21a has a width of 6 μm. Further, the first connection line 21b has a line width of 3 μm, and a space k2 between the same and an adjacent one of the first connection lines 21b has a width of 6 μm. The first connection line 21a and the first connection line 21b are parallel, and are partially superposed on each other. An overlap width k3 over which the first connection line 21a and the first connection line 21b are superposed is 1 μm. Besides, the second connection lines 24c has a line width of 3 μm, and the space k4 between adjacent ones of the second connection lines 24c has a width of 9.5 μm.

The overlap width k3 over which the first connection line 21a and the first connection line 21b are superposed may be less than 1 μm, or may be 1 μm or more and less than 3 μm. Further, the line widths of the first connection lines 21a and the first connection lines 21b do not have to be equal. Still further, the line widths of the first connection lines 21a, the first connection line 21b, and the second connection lines 24c, spaces between adjacent ones of the lines, are not limited to the values described above.

Figure 17:
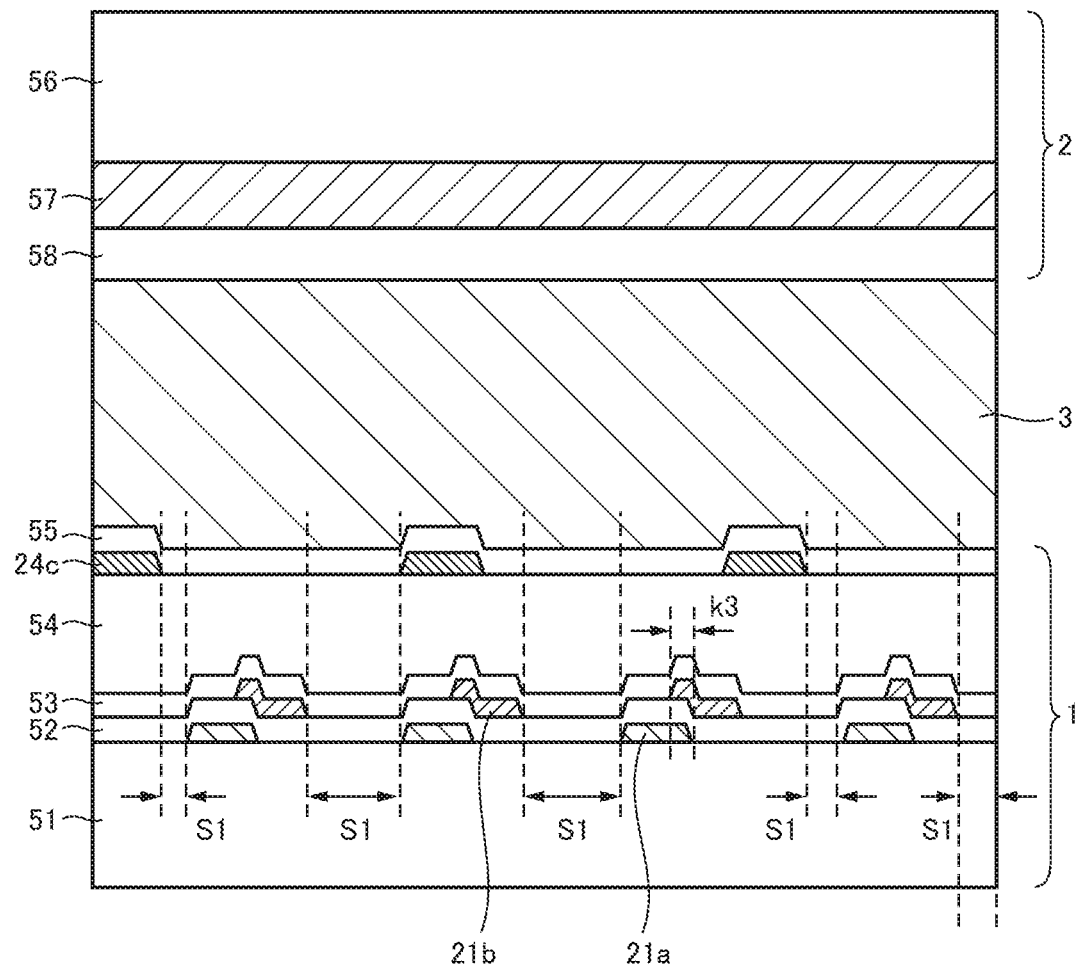
FIG. 17 is a cross-sectional view taken along a cutting-plane line XVII-XVII in FIG. 16.

FIG. 17 is a cross-sectional view taken along a cutting-plane line XVII-XVII in FIG. 16. The first connection line 21b formed in the second line layer partially overlaps with the first connection line 21a formed in the first line layer. The overlap width k3 is, for example, 1 μm.

In the sealing member 3 in the present embodiment, a photocurable resin that is cured when being irradiated with light is used. Light is projected form the glass substrate 51 side of the active matrix substrate 1. Since the first connection lines 21a, the first connection lines 21b, and the second connection lines 24 are formed with opaque metal films having low light permeability, light projected from the glass substrate 51 side reaches the sealing member 3 through areas S1 in which none of the first connection lines 21a, the first connection lines 21b, and the second connection lines 24 is formed. As illustrated in FIG. 16, since the first connection lines 21a and the first connection lines 21b partially overlap, the areas S1 (hereinafter referred to as light-transmitting areas S1) in which none of the first connection lines 21a, the first connection lines 21b, and the second connection lines 24 is formed, as compared with the configuration in which the first connection lines 21a and the first connection lines 21b do not overlap. This makes it possible to irradiate the sealing member 3 with sufficient light, thereby preventing the sealing member 3 from being undercured at the time of manufacture of the display device 100.

Figure 18:
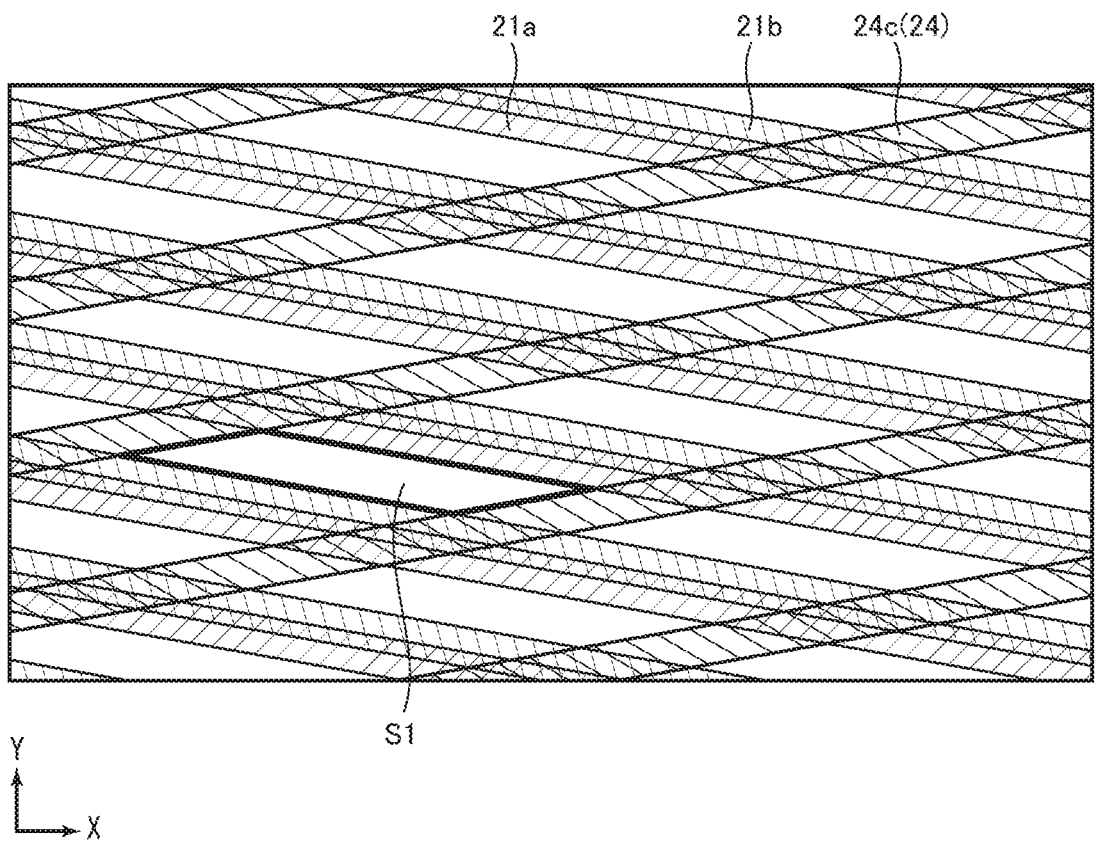
FIG. 18 is a plan view illustrating a light-transmitting area S1 in Embodiment 4.
Figure 22:
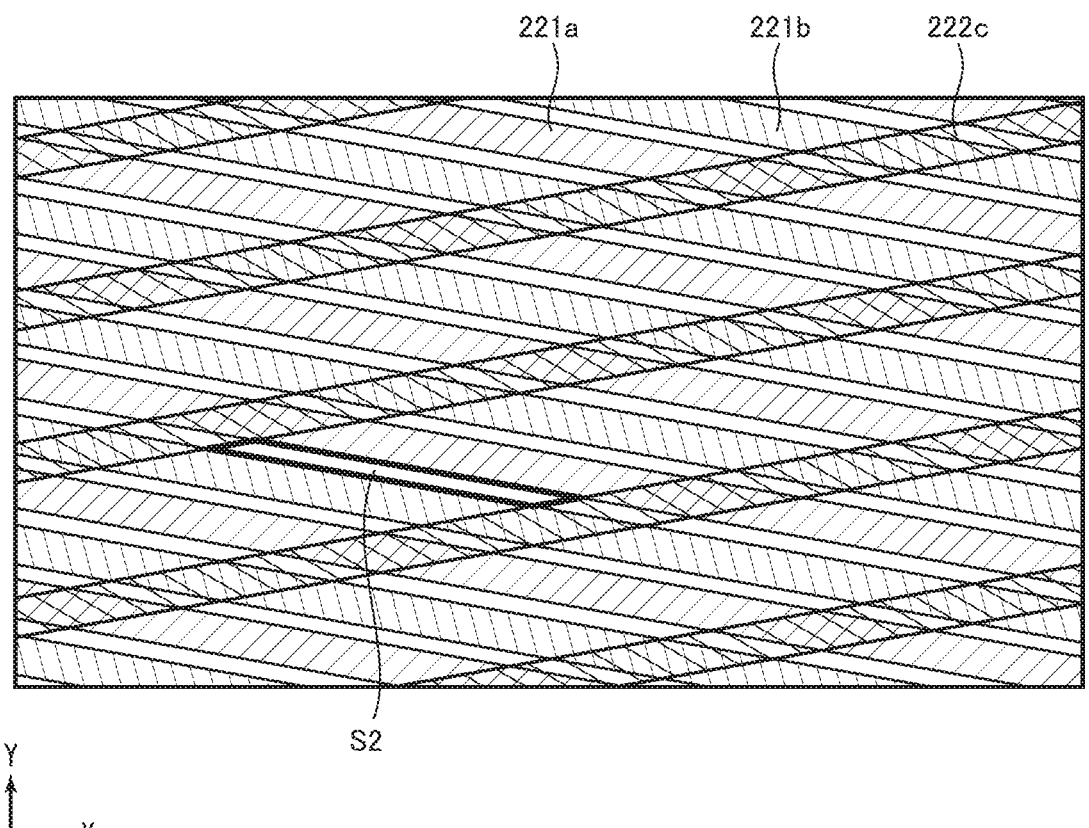
FIG. 22 is a plan view illustrating a light-transmitting area in a comparative configuration in which first connection lines do not overlap when viewed in a plan view.

The following description describes difference between the width of the light-transmitting area S1 in the present embodiment in which the first connection lines 21a and first connection lines 21b, formed in different layers, respectively, overlap partially with each other when viewed in a plan view, and the width of a light-transmitting area S2 in a comparative configuration in which the first connection lines 21a and the first connection lines 21b do not overlap with each other when viewed in a plan view. FIG. 18 is a plan view illustrating the light-transmitting area S1 in the present embodiment. Further, FIG. 22 is a plan view illustrating a light-transmitting area S2 in a comparative configuration in which first connection lines 221a and 221b do not overlap with each other when viewed in a plan view. The light-transmitting area S2 is an area surrounded by the first connection line 221a, the first connection line 221b, and the second connection lines 222c.

In the case of the comparative configuration illustrated in FIG. 22, the ratio of the light-transmitting areas S2 in the sealing area is about 25%. On the other hand, in the case of the configuration of the present embodiment illustrated in FIG. 18, the ratio of the light-transmitting areas S1 in the sealing area 20 is about 33%. This value of 33% is equal to the ratio of the light-transmitting areas in the comparative configuration illustrated in FIG. 22 from which the second connection lines 222c are removed, and this does not cause the sealing member 3 to become undercured. This was confirmed by the inventors of the present application.

More specifically, in the case of the display device 100 in the present embodiment, even if it is such a configuration that the touch sensor lines 14 and the second connection lines 24 as constituent members for detecting a touch position are arranged on a display device having no touch detection function, the ratio of the light-transmitting area in the sealing area 20, which is equal to the ratio of the same in the display device having no touch detection function, can be maintained. This makes it possible to prevent the sealing member 3 from becoming undercured, thereby providing a high-quality display device.

In order to ensure a wide light-transmitting area S1 as compared with the comparative configuration, it is only required that those adjacent in a plan view of the first connection lines 21a and the first connection lines 21b at least partially overlap with each other. When the active matrix substrate 1 is manufactured, however, in some cases, a misalignment of more or less 1 μm occurs to the second line layer, in which the first connection lines 21b are formed, with respect to the first line layer, in which the first connection lines 21a are formed. Further, in some cases, the line width of the first connection lines 21a and the first connection lines 21b varies by more or less 1 μm. Such a misalignment or the variation of the line width becomes noticeable in a large mother glass plate from which a plurality of liquid crystal panels can be obtained at the time of manufacture of display devices.

In a case where the overlap width k3 of the first connection lines 21a and the first connection lines 21b is less than 1 μm, there is a possibility that a sufficient light-transmitting area cannot be ensured due to misalignment, variation of the line width, and the like described above. The overlap width k3 of the first connection lines 21a and the first connection lines 21b, therefore, is preferably at least 1 μm. More preferably, the overlap width k3 of the first connection lines 21a and the first connection lines 21b is 2 μm or more.

Incidentally, as illustrated in FIG. 3, the sealing area 20 includes areas where the second connection lines 24a formed in the first line layer and the second connection lines 24b formed in the second line layer are formed. More specifically, in the sealing area 20, in the areas between the touch sensor inspection patterns 22 and the touch sensor signal output terminals 25, the second connection lines 24a and the second connection lines 24b are formed. This area may be caused to have such a configuration that adjacent ones of the second connection lines 24a and the second connection lines 24b are partially superposed. With this configuration, the light-transmitting areas 51 can be made further wider, whereby it is possible to more effectively prevent the sealing member 3 from becoming undercured.

Modification Configuration 1 of Embodiment 4

Figure 19:
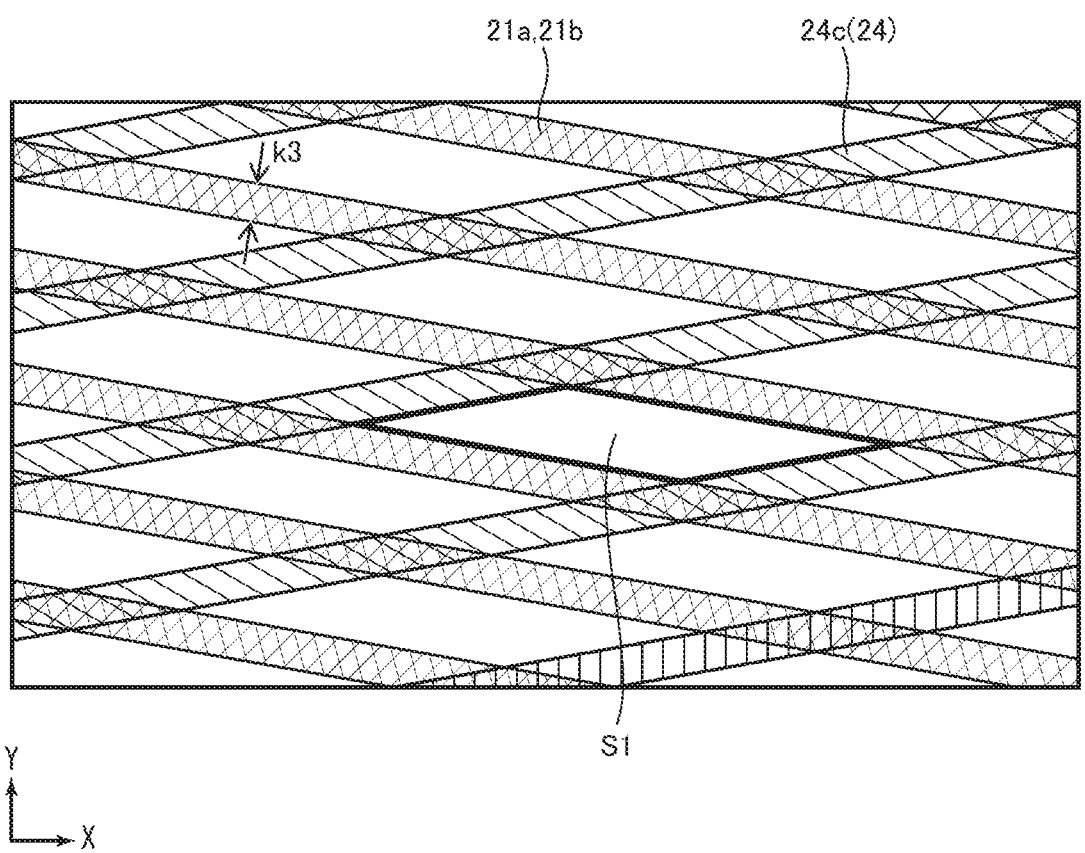
FIG. 19 is an enlarged plan view illustrating, in a sealing area, an area that includes areas where first connection lines and second connection lines are partially superposed, when viewed in a plan view, in Modification Configuration 1 of Embodiment 4.

FIG. 19 is an enlarged plan view illustrating, in a sealing area 20, an area that includes areas where the first connection lines 21a and 21b, and the second connection lines 24c are partially superposed, when viewed in a plan view, in Modification Configuration 1 of Embodiment 4. In Modification Configuration 1 of Embodiment 4, ones adjacent in plan view of the first connection lines 21a and the first connection lines 21b completely overlap with each other. In other words, the line width of the first connection lines 21a and the first connection lines 21b is 3 μm, which is the same as in Embodiment 1, but the overlap width k3 of the first connection lines 21a and the first connection lines 21b is 3 μm.

The ratio of the light-transmitting areas S1 in the sealing area 20 in this case is about 50%. More specifically, according to Modification Configuration 1 of Embodiment 4, the light-transmitting area S1 can be widened as compared with the configuration in Embodiment 4, whereby it is possible to more effectively prevent the sealing member 3 from becoming undercured.

Incidentally, according to the results of experiments performed by the inventors of the present application, if the ratio of the light-transmitting areas S1 is at least 33%, the sealing member 3 does not become undercured. The configuration in which adjacent ones of the first connection lines 21a and the first connection lines 21b overlap completely, therefore, makes it possible to maintain the ratio of the light-transmitting areas to 33%, while increasing the line width of the first connection lines 21a and the first connection lines 21b. By increasing the line width of the first connection lines 21a and the first connection lines 21b, the occurrence of a disconnection to the first connection lines 21a and the first connection lines 21b can be suppressed, whereby the yield at the time of manufacture can be improved. Instead of increasing the line width of the first connection lines 21a and the first connection lines 21b, the line width of the second connection lines 24 may be increased.

Further, as illustrated in FIG. 3, the sealing area 20 includes areas where the second connection lines 24a formed in the first line layer and the second connection lines 24b formed in the second line layer are formed. This area may be caused to have such a configuration that the second connection lines 24a and the second connection lines 24b connected to adjacent two of the second connection lines 24c completely overlap each other. With this configuration, the light-transmitting areas S1 can be made further wider, whereby it is possible to more effectively prevent the sealing member 3 from becoming undercured.

Modification Configuration 2 of Embodiment 4

Figure 20:
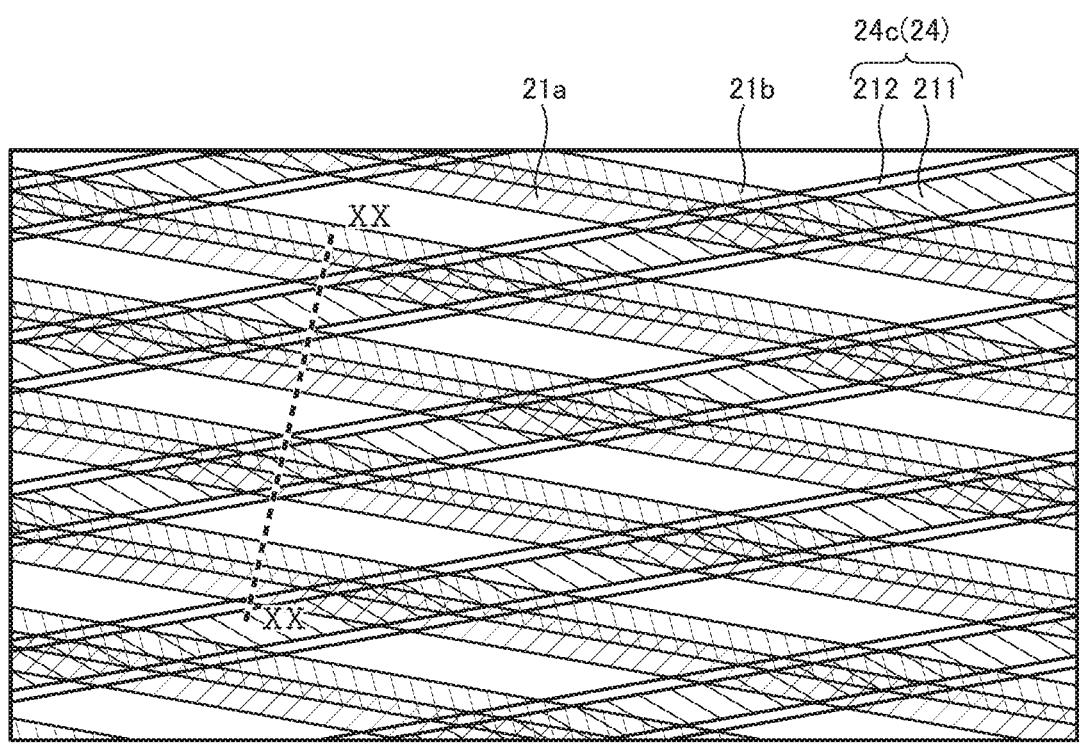
FIG. 20 is an enlarged plan view illustrating, in a sealing area, an area that includes areas where first connection lines and second connection lines are partially superposed, when viewed in a plan view, in Modification Configuration 2 of Embodiment 4.
Figure 21:
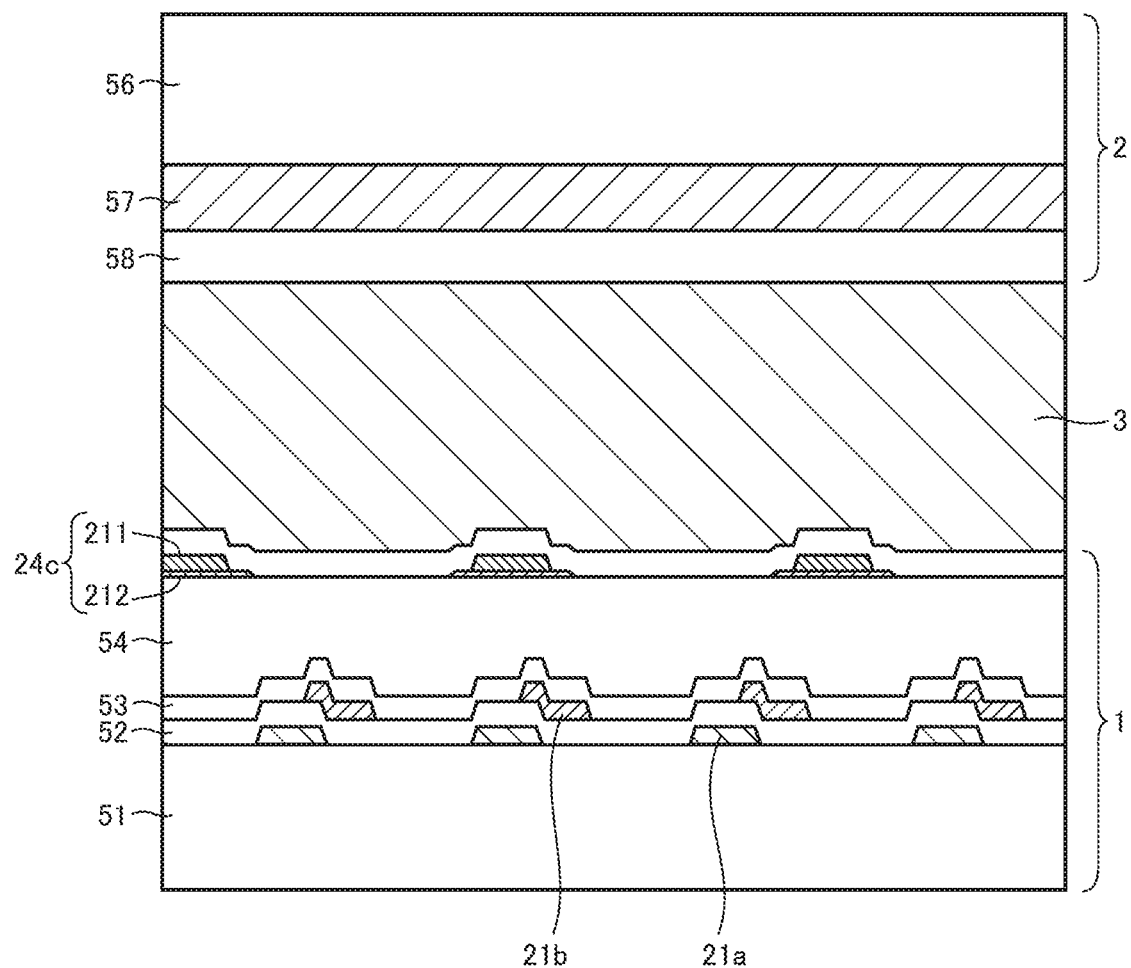
FIG. 21 is a cross-sectional view taken along a cutting-plane line XX-XX in FIG. 20.

FIG. 20 is an enlarged plan view illustrating, in a sealing area 20, an area that includes areas where first connection lines 21a and 21b and the second connection lines are partially superposed, when viewed in a plan view, in Modification Configuration 2 of Embodiment 4. FIG. 21 is a cross-sectional view taken along a cutting-plane line XX-XX in FIG. 20.

In the present embodiment, as illustrated in FIG. 21, each of the second connection lines 24c is formed in a two-layer configuration, composed of a metal film 211 and a transparent conductive film 212. More specifically, under the metal film 211, the transparent conductive film 212 is formed. The metal film 211 is a film of an opaque metal having low light permeability, for example, copper, titanium, molybdenum, aluminum, chromium, or the like, or alternatively, an alloy of any of these. The transparent conductive film 212 is made of, for example, ITO. The material of the transparent conductive film 212, however, is not limited to ITO, but may be made of another transparent conductive material such as IZO. Since the transparent conductive films 212 are formed in the same layer as the layer of the pixel electrodes, the transparent conductive films 212 can be formed into a pattern by using the same material as that for the pixel electrodes, through the same step.

Further, as is the case with the second connection lines 24c, each of the touch sensor lines 14 formed in the third line layer is formed in a two-layer configuration composed of a metal film and a transparent conductive film.

The metal film 211 has a line width smaller than the line width of the transparent conductive film 212. For example, the metal film 211 has a line width of 3 μm, and the transparent conductive film 212 has a line width of 5 μm. These are merely exemplary values, and the transparent conductive film may have a line width of, for example, 5 μm or more (for example, 7 μm or more).

ITO has a resistance that is one order higher, compared with such a metal as copper or aluminum. In a case where all of the touch sensor lines 14 and the second connection lines 24c are formed with transparent conductive films made of such a material as ITO, therefore, the signal transmission properties deteriorate. In the present embodiment, however, each of the touch sensor lines 14 and the second connection lines 24c is formed in a two-layer configuration composed of the metal film 211 and the transparent conductive film 212, whereby light-transmitting parts are ensured, while the lines can be caused to have low resistance and excellent redundancy.

Here, by utilizing the redundancy, the configuration may be as follows: the metal films 211 of the second connection lines 24c in the sealing area 20 have a smaller line width (for example, 2 μm), and the metal films 211 in the area on an inner side with respect to the sealing area 20 (on the display area 10 side) have a greater line width (for example, 4 μm). By decreasing the line width of the metal films 211 in the sealing area 20, the light-transmitting areas S1 allowing light to be projected to the sealing member 3 can be made wider. Further, by increasing the line width of the metal films 211 in the area on the inner side with respect to the sealing area 20, the resistance can be reduced, and the occurrence of a disconnection to the metal films 211 can be suppressed, whereby the yield at the time of manufacture can be improved.

The above-described embodiments are merely an example for implementing the present invention. The present invention, therefore, is not limited to the above-described embodiments, and the above-described embodiment can be appropriately varied and implemented without departing from the spirit and scope of the invention. For example, technical characteristics of the respective embodiments and the modification configurations of the embodiments can be appropriately combined.

Each embodiment described above is described with reference to an exemplary configuration in which the display device 100 is a liquid crystal display having a touch sensor function, but the display device is not limited to a liquid crystal display having a touch sensor function. For example, the display device 100 may be an organic electroluminescence (organic EL) display that does not incorporate a touch panel. In the case where the display device 100 is an organic EL display, the first lines can correspond to the gate lines, the second lines can correspond to the source lines, and the third lines can correspond to the lines that supply an electric current to the organic EL layer during a light emission period. For example, the gate bus lines 113, the data bus lines 112, and the light emission control lines 121 in an active matrix type organic EL display in Embodiment 8 disclosed in WO 2013/157285 can correspond to the first lines, the second lines, and the third lines, respectively.

In each of the above-described embodiments, each gate line 12 extends in the X axis direction, and a plurality of the same are arrayed in the Y axis direction; and each source line 13 extends in the Y axis direction, and a plurality of the same are arrayed in the X axis direction. The configuration, however, may be such that each gate line 12 extends in the Y axis direction, and a plurality of the same are arrayed in the X axis direction; and each source line 13 extends in the X axis direction, and a plurality of the same are arrayed in the Y axis direction.

Each of the above-described embodiments is described with reference to an example in which the first lines are the gate lines 12, the second lines are the source lines 13, and the third lines are the touch sensor lines 14, but the first to third lines are not limited to these lines.

In the configuration described above, the driving mode for driving the liquid crystal molecules contained in the liquid crystal layer of the liquid crystal display is the horizontal electric field driving mode for horizontal alignment, such as the IPS mode or the FFS mode, but the mode may be another mode. For example, the driving mode may be a horizontal electric field driving mode for driving liquid crystal with negative dielectric anisotropy, using vertical alignment films.

Here, as a method for aligning liquid crystal, a method involving forming an alignment support layer on an alignment film is known, wherein the alignment support layer is made of a polymer. In liquid crystal displays of the VA mode (vertical alignment mode), this has been practically implemented as, for example, the polymer sustained alignment (PSA) technique. More specifically, photopolymerizable monomers are added in liquid crystal, and in a state in which a voltage is being applied to the liquid crystal (in a state in which liquid crystal molecules are tilted from the vertical direction), the monomers are polymerized with light or heat. Here, on an alignment film (a vertical alignment film in the case of the VA mode), a polymer layer is formed that causes the direction of initial alignment of liquid crystal molecules to be tilted slightly (2 to 3 degrees) from the vertical alignment direction.

The alignment method using such a polymer is used in the case of the horizontal electric field driving mode such as the IPS mode or the FFS mode. In the case of the horizontal electric field driving mode, polymer is formed on a horizontal alignment film to which an alignment treatment is applied by rubbing or light alignment, but the polymerization of the monomer is performed in a state I which no voltage is applied to liquid crystal. If charges are accumulated in pixel electrodes or counter electrodes during this polymerization, the polymerization is achieved with liquid crystal being in an unfavorable alignment state, which leads to display irregularities or the reduction of the contrast. To cope with this, the switching elements 61 included in the touch sensor lines 14, the second connection lines 24, and the touch sensor inspection patterns 22 are used so as to disperse charges in the pixel electrodes or the counter electrodes 31, so that any voltage should not be applied to the liquid crystal. In other words, the switching elements 61 included in the touch sensor lines 14, the second connection lines 24, and the touch sensor inspection patterns 22 can be used, not only for inspecting a disconnection, a short circuit, or the like in the touch sensor lines 14 and the second connection lines 24, but also for dispersing charges in the above-described pixel electrodes or the counter electrodes 31.

The touch position detection method is the method of a so-called self-capacitance type, but may be the method of a mutual capacitance type. In other words, the present invention can be applied to a display device of the mutual capacitance type, having a function of detecting a touch position.

A specific pattern displayed during inspection is not limited to the above-described stripe pattern or checkered pattern.

In the configuration described above, the source lines 13 are provided within the display area 10, and the first connection lines 21 connected with the source lines 13 are provided in the non-display area. The source lines 13, however, may have such a length that the source lines 13 are arranged not only inside the display area 10 but also in the non-display area. Further, the foregoing description discusses that the source lines 13 are connected through the first connection lines 21 with the source line signal output terminals 26, but all of the source lines 13 and the first connection line 21 can be referred to as source lines, without distinction. The same holds for the gate lines 12 and the touch sensor lines 14.

DESCRIPTION OF REFERENCE NUMERALS

1: active matrix substrate
2: counter substrate
3: sealing member
10: display area
11: driving circuit
12: gate line
13: source line
14: touch sensor line
18: source line inspection pattern
20: sealing area
21a,21b: first connection line
22: touch sensor inspection pattern
23: touch sensor inspection signal input terminal
24a,24b,24c: second connection line
25: touch sensor signal output terminal
26: source line signal output terminal
61: inspection TFT (switching element)
63: first common line
64: second common line
211: metal film
212: transparent conductive film
100: display device
101: dummy connection line

The invention claimed is:

1. A display device comprising:
an active matrix substrate;
a counter substrate opposed to the active matrix substrate;
a display function layer arranged between the active matrix substrate and the counter substrate to display an image in a display area of the display device, the display area being surrounded by a non-display area in which an image is not displayed;
common electrodes arrayed in matrix in the display area; and
a sealing member that seals the display function layer between the active matrix substrate and the counter substrate,
wherein the active matrix substrate includes:
first lines formed in a first line layer;
second lines formed in a second line layer that is different from the first line layer;
third lines formed in a third line layer that is different from the first line layer and the second line layer, a signal that is different from a signal supplied to the first lines and the second lines being supplied to the third lines;
first terminals electrically connected to the first lines or the second lines;
second terminals electrically connected with the third lines;
first connection lines that connect the first lines or the second lines with the first terminals:
second connection lines that connect the third lines with the second terminals:
second connection line switching elements that are connected with the second connection lines; and
two or more common lines each of which is connected with any one of a plurality of the second connection line switching elements,
wherein each of the second connection lines is connected with any one of the two or more common lines through the second connection line switching element,
among spaces each of which is between adjacent two of the second connection lines, a space between the second connection lines connected to the same one of the common lines through the second connection line switching elements is wider than a space between the second connection lines that are connected to different ones of the common lines, respectively, through the second connection line switching elements,
the common electrodes are provided in a layer different from the third line layer and connected with the third lines,
the first lines and the second lines are arranged in the display area, and
the first connection lines, the second connection lines, the second connection line switching elements and the common lines are arranged in the non-display area.

2. A display device comprising:
an active matrix substrate;
a counter substrate opposed to the active matrix substrate;
a display function layer arranged between the active matrix substrate and the counter substrate to display an image in a display area of the display device, the display area being surrounded by a non-display area in which an image is not displayed;
common electrodes arrayed in matrix in the display area; and
a sealing member that seals the display function layer between the active matrix substrate and the counter substrate,
wherein the active matrix substrate includes:
first lines formed in a first line layer;
second lines formed in a second line layer that is different from the first line layer;
third lines formed in a third line layer that is different from the first line layer and the second line layer, the third lines being lines different from the first lines and the second lines;
first terminals electrically connected to the first lines or the second lines;
second terminals electrically connected with the third lines;
first connection lines that connect the first lines or the second lines with the first terminals;
second connection lines that connect the third lines with the second terminals;

second connection line switching elements that are connected with the second connection lines;

two or more common lines each of which is connected with any one of a plurality of the second connection line switching elements; and a dummy line arranged between two adjacent ones of the second connection lines, wherein each of the second connection lines is connected with any one of the two or more common lines through the second connection line switching element, the dummy line is arranged between two adjacent ones of the second connection lines, the two adjacent ones being connected to the same one of the two or more common lines through the second connection line switching elements, the common electrodes are provided in a layer different from the third line layer and connected with the third lines, the first lines and the second lines are arranged in the display area, and the first connection lines, the second connection lines, the second connection line switching elements and the common lines are arranged in the non-display area.

3. The display device according to claim 1,
wherein each of the second connection lines has a part formed in the third line layer and a part formed in the first line layer or the second line layer, and a boundary between the part formed in the third line layer, and the part formed in the first line layer or the second line layer, is present in a sealing area where the sealing member is arranged, or in an area between the sealing area and the display area.

4. The display device according to claim 3,
wherein at least parts of two adjacent ones of the second connection lines are formed alternately in the first line layer and the second line layer, in a region between the sealing area and the second terminals.

5. The display device according to claim 4,
wherein at least the parts of two adjacent ones of the second connection lines, which are formed alternately in the first line layer and the second line layer, are superposed on each other when viewed in a plan view.

6. The display device according to claim 1,
wherein the second connection line switching elements are arranged in the sealing area where the sealing member is arranged, or in the area between the sealing area and the display area.

7. The display device according to claim 1,
wherein the active matrix substrate further includes electrodes each of which is connected with any one of the two or more common lines, through the second connection lines, the two or more common lines include a first common line and a second common line, and the electrodes connected with the first common line through the second connection lines, and the electrodes connected with the second common line through the second connection lines, are arranged in a stripe form.

8. The display device according to claim 1,
wherein the active matrix substrate further includes electrodes each of which is connected with any one of the two or more common lines, through the second connection lines, the two or more common lines include a first common line and a second common line, and the electrodes connected with the first common line through the second connection lines, and the electrodes connected with the second common lines through the second connection lines, are arranged in a checkered pattern form.

9. The display device according to claim 1,
wherein the active matrix substrate further includes first connection line switching elements electrically connected with the first terminals, and the first connection line switching elements are arranged on a side opposite to the first connection lines with respect to the first terminals, so that the first terminals are interposed therebetween.

10. The display device according to claim 9,
wherein the first connection line switching elements are arranged on a side opposite to the first connection lines and the second connection lines with respect to the first terminals and the second terminals, so that the first terminals and the second terminals are interposed therebetween.

11. The display device according to claim 1,
wherein the sealing member is made of a material that is cured when being irradiated with light, either of two of the first connection lines that are respectively connected to two adjacent ones of the first lines or to two adjacent ones of the second lines is at least partially formed in one of the first line layer and the second line layer, and the other one of the two of the first connection lines is at least partially formed in the other one of the first line layer and the second line layer, and the first connection lines and the second connection lines are partially superposed when viewed in a plan view, in the sealing area where the sealing member is arranged, and in areas that are in the sealing area and where the first connection lines and the second connection lines are superposed, the two of the first connection lines are at least partially superposed when viewed in a plan view.

12. The display device according to claim 11,
wherein, in areas that are in the sealing area and where the first connection lines and the second connection lines are superposed, the two of the first connection lines are superposed over the full width thereof when viewed in a plan view.

13. The display device according to claim 1,
wherein the second connection line switching elements are arranged on a side opposite to the second connection lines with respect to the second terminals, so that the second terminals are interposed therebetween.

14. The display device according to claim 2,
wherein the dummy line is connected, through the second connection line switching element, to the common line that is different from the common line to which two of the second connection lines arranged on both sides of the dummy line are connected through the second connection line switching elements.

15. The display device according to claim 1,
wherein the common electrodes are a plurality of touch position detection electrodes.

* * * * *